(12) United States Patent
Liu et al.

(10) Patent No.: US 9,411,242 B2
(45) Date of Patent: Aug. 9, 2016

(54) EXPOSURE APPARATUS AND EXPOSURE METHOD THEREOF

(71) Applicant: Semiconductor Manufacturing International (Shanghai) Corporation, Shanghai (CN)

(72) Inventors: Chang Liu, Shanghai (CN); Qiang Wu, Shanghai (CN)

(73) Assignee: SEMICONDUCTOR MANUFACTURING INTERNATIONAL (SHANGHAI) CORPORATION, Shanghai (CN)

(*) Notice: Subject to any disclaimer, the term of this patent is extended or adjusted under 35 U.S.C. 154(b) by 348 days.

(21) Appl. No.: 14/040,685

(22) Filed: Sep. 29, 2013

(65) Prior Publication Data

US 2014/0253897 A1 Sep. 11, 2014

(30) Foreign Application Priority Data

Mar. 5, 2013 (CN) .......................... 2013 1 0069924

(51) Int. Cl.
| | |
|---|---|
| *G03B 27/32* | (2006.01) |
| *G03B 27/54* | (2006.01) |
| *G03B 27/58* | (2006.01) |
| *G03F 7/20* | (2006.01) |
| *G01D 5/347* | (2006.01) |
| *H01L 21/68* | (2006.01) |
| *G03F 9/00* | (2006.01) |
| *G03F 1/42* | (2012.01) |
| *G03F 7/24* | (2006.01) |

(52) U.S. Cl.
CPC ........ *G03F 7/70141* (2013.01); *G01D 5/34746* (2013.01); *G03F 1/42* (2013.01); *G03F 7/703* (2013.01); *G03F 7/70725* (2013.01); *G03F 7/70733* (2013.01); *G03F 7/70775* (2013.01); *G03F 9/7003* (2013.01); *G03F 9/7088* (2013.01); *H01L 21/681* (2013.01); *H01L 21/682* (2013.01); *G03F 7/24* (2013.01)

(58) Field of Classification Search
CPC ......... G01D 5/34746; G03F 1/00; G03F 1/38; G03F 1/42; G03F 7/24; G03F 7/70141; G03F 7/703; G03F 7/70616; G03F 7/70725; G03F 7/70733; G03F 7/70716; G03F 7/70775; G03F 9/70; G03F 9/7003; G03F 9/7007; G03F 9/7011; G03F 9/7088; H01L 21/68; H01L 21/681; H01L 21/682
USPC ............. 310/12.05, 12.06, 12.19; 355/53, 67, 355/71, 72, 75, 77
See application file for complete search history.

(56) References Cited

U.S. PATENT DOCUMENTS

| | | | |
|---|---|---|---|
| 2005/0139790 A1 | 6/2005 | Boogaarts et al. | |
| 2005/0140955 A1* | 6/2005 | Butler .................... | G03B 27/72 355/69 |
| 2007/0263197 A1* | 11/2007 | Luttikhuis .............. | G03B 27/53 355/55 |

(Continued)

*Primary Examiner* — Colin Kreutzer
(74) *Attorney, Agent, or Firm* — Anova Law Group, PLLC

(57) ABSTRACT

A wafer alignment system is provided for performing a unidirectional scan-exposure. The wafer alignment system includes a plurality of wafer stages successively moving from a first position to a second position of a base cyclically. The wafer alignment method also includes an encoder plate having a first opening and a second opening. Further, the wafer alignment system includes a plurality of encoder plate readers and a plurality of wafer stage fiducials on the wafer stages. Further, the wafer alignment system also includes an alignment detection unit above the first opening of the encoder plate.

15 Claims, 9 Drawing Sheets

(56) References Cited

U.S. PATENT DOCUMENTS

| | | | |
|---|---|---|---|
| 2009/0059194 A1* | 3/2009 | Kanaya | G03F 7/70775 355/53 |
| 2009/0115985 A1* | 5/2009 | Maeda | G03B 27/52 355/55 |
| 2009/0170014 A1* | 7/2009 | Shibazaki | G03F 1/14 430/5 |
| 2010/0245797 A1* | 9/2010 | Goodwin | G03B 27/58 355/72 |
| 2011/0123913 A1* | 5/2011 | Yoshimoto | G03F 7/707 430/30 |
| 2014/0253896 A1* | 9/2014 | Wu | G03F 7/70141 355/71 |

* cited by examiner

EXPOSURE APPARATUS AND EXPOSURE METHOD THEREOF

CROSS-REFERENCES TO RELATED APPLICATIONS

This application claims the priority of Chinese patent application No. 201310069924.2, filed on Mar. 5, 2013, the entirety of which is incorporated herein by reference.

FIELD OF THE INVENTION

The present invention generally relates to the field of semiconductor manufacturing technology and, more particularly, relates to exposure apparatus and exposure methods thereof.

BACKGROUND

Photolithography process is a very important process of the semiconductor manufacturing technology, which transfers patterns on a mask to a substrate by an exposure process. The photolithography process is a core step of the manufacturing of large scale integrations (LSIs). The complex and time-consuming photolithography process of the semiconductor manufacturing technology is mainly performed by corresponding exposure apparatus. Further, the development of the photolithography technology or the improvement of the exposure apparatus are mainly focused on three specifications including feature size, overlay resolution, and yield.

In the manufacturing of a semiconductor device, the photolithography process may include three main steps: changing wafers on the wafer stages; aligning the wafers on the wafer stages; and transferring patterns on the mask to the wafers. These three steps may be sequentially repeated on the same wafer stage.

Since the photolithography process is a key step of the semiconductor manufacturing process, how to improve the yield of an exposure apparatus in the practical manufacturing process has become a very important topic. Various exposure apparatuses with twin-stages have been developed in past a few years in order to further increase the yield of the exposure apparatuses.

FIG. 1 illustrates an existing exposure apparatus with twin-stages. The exposure apparatus includes a first stage 101 and a second stage 102 for holding wafers; an alignment detection unit 103 for detecting align marks on wafers and aligning wafers; a mask stage 107 for holding a mask 108; an optical projection unit 104 under the mask stage 107 for projecting light through the mask 108 on the wafers on the first stage 101 or the second stage 102 and performing an exposure on the wafers; and an illuminator 109 above the mask stage 107 for providing an exposure light.

An exposure process using the existing tool may include sequentially: aligning the first wafer 106; moving the first stage 101 under the optical projection unit 104; and performing an exposure on the first wafer 106 using the optical projection unit 106 which projects light through the mask 108 on the first wafer 106. At the same time, a second wafer 105 may be installed on the second stage 102, and moved under the alignment detection unit 103. The alignment detection unit 103 may detect the alignment mark on the second wafer 105 on the second stage; and the second wafer 105 may be aligned. After the first wafer 106 is exposed, a new wafer may be installed on the first stage 101, and the first stage 101 with the new wafer may be moved under the alignment detection unit 103. The alignment detection unit 103 may align the new wafer. At the same time, the second stage 102 may be moved under the optical projection unit 104, and the second wafer 105 may be exposed by the optical projection unit 104.

However, even with such improvements, the exposure efficiency and the yield of the existing exposure apparatuses may still be relatively low. The disclosed methods and systems are directed to solve one or more problems set forth above and other problems.

BRIEF SUMMARY OF THE DISCLOSURE

One aspect of the present disclosure includes a wafer alignment system for performing a unidirectional scan-exposure. The wafer alignment system includes a plurality of wafer stages successively moving from a first position to a second position of a base cyclically. The wafer alignment system also includes an encoder plate having a first opening and a second opening. Further, the wafer alignment system includes a plurality of encoder plate readers and a plurality of wafer stage fiducials on the wafer stages. Further, the wafer alignment system also includes an alignment detection unit above the first opening of the encoder plate.

Another aspect of the present disclosure includes a wafer alignment method. The wafer alignment method includes loading a wafer on each of a plurality of wafer stages successively; and moving one of the wafer stages loaded with the wafer to a first position successively. The wafer alignment method also includes zeroing the wafer at the first position using zeroing mark detection units to detect the zeroing marks on an encoder plate. Further, the wafer alignment method includes aligning and leveling the wafer stage with the wafer using the alignment detection unit to detect wafer stage fiducials. Further, the wafer alignment method also includes obtaining a position information of a to-be-exposed column of exposure regions by detecting alignment marks on the wafer using an alignment detection unit.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
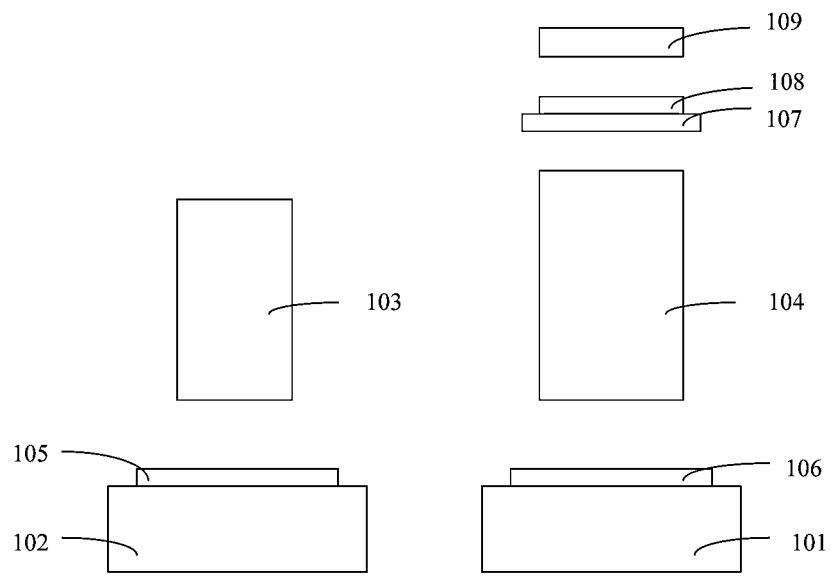
FIG. 1 illustrates an existing exposure apparatus and exposure process.
Figure 2:
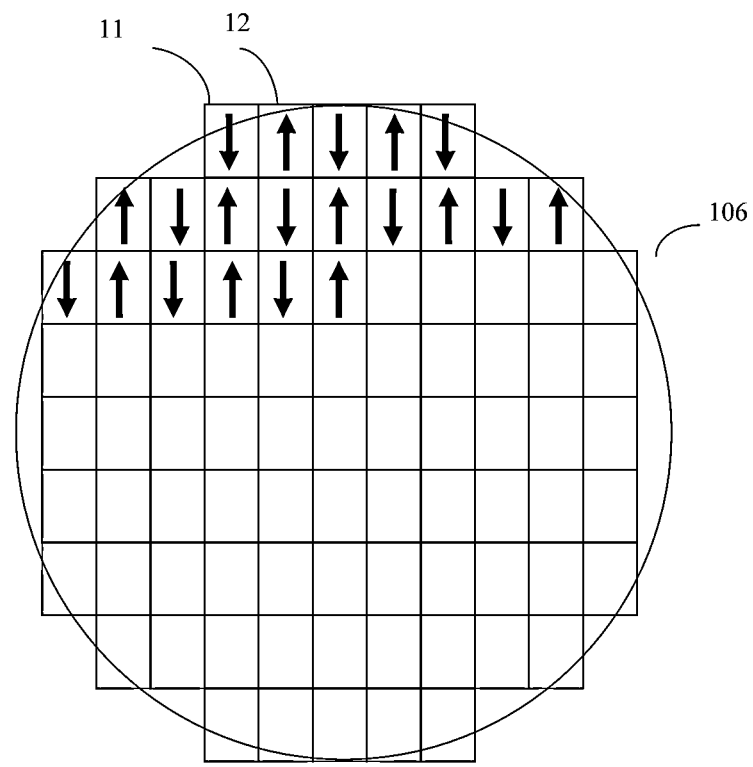
FIG. 2 illustrates scanning directions for each exposure regions of the existing exposure apparatus.

FIG. 2 illustrates scanning directions of the existing exposure apparatus for each exposure regions of a wafer, i.e., the direction of an arrow may refer to the scanning direction. For example, referring to FIG. 1, for each scanning, the stage (the first stage 101 or the second stage 102) may move along the scanning direction, and the mask stage 107 with the mask 108 may move along an opposite direction, and a first exposure region may be exposed. After exposing the first exposure region, a second exposure region may be exposed.

As shown in FIG. 2, the first wafer 106 may have a plurality of exposure regions. Referring FIGS. 1-2, the first stage 101 may move along a first direction to scan and expose a first exposure region 11. Wherein the first direction is the direction of the arrow shown in first exposed region 11. After exposing the first exposure region 11, a second exposure region 12 adjacent to the first exposure region 11 may be exposed by moving the first stage 101 with a direction opposite to the first direction which may be referred as a second direction as shown in the second exposure region 12. Scanning (or exposures) along the first direction and the second direction may be sequentially repeated until all the exposure regions of the first wafer 106 are exposed.

An accelerating process, a scanning and exposing process and a decelerating process may thus exist in every scanning (or exposure) when the existing exposure apparatus (or method) is used. The accelerating process and the decelerating process may be used to improve the accuracy and efficiency of changing exposure regions, and they may be unable to aid the actual exposure of wafers although occupying a portion of the total time of the exposure process. Thus, the accelerating process and the decelerating process may waste time, and may cause a relatively low yield in per unit time.

FIGS. 3-9 illustrate certain structures of an exemplary exposure apparatus consistent with the disclosed embodiments.

Figure 3:
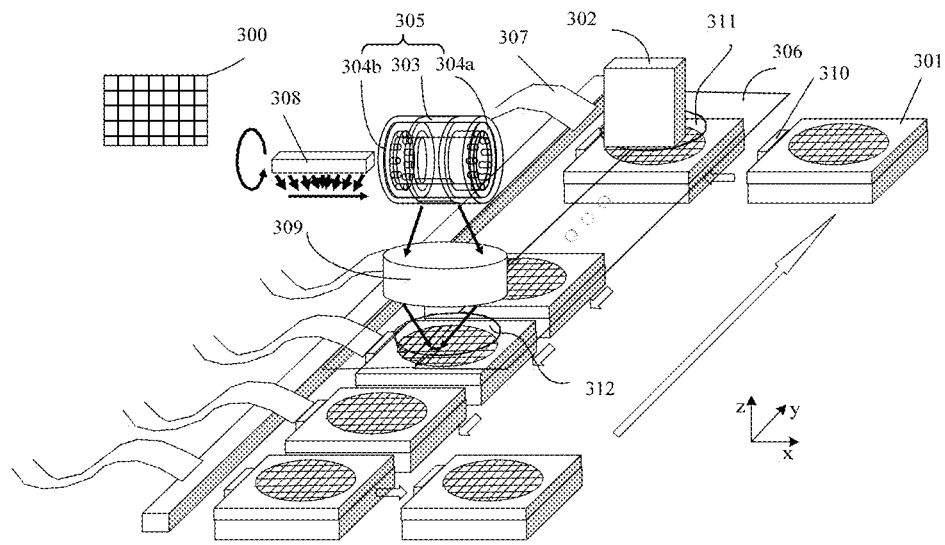
FIGS. 3-9 illustrate certain structures of an exemplary exposure apparatus consistent with the disclosed embodiments.

FIG. 3 illustrates an exemplary exposure apparatus. As shown in FIG. 3, the exposure apparatus includes a base (not shown). The base may provide a moving region for wafer stages. The base may be designed with any appropriate size and geometry. Certain damping system may also be included in the base to reduce vibration, or other kind of noises. Other necessary components may also be installed in the base to make it have desired functionalities.

The exposure apparatus also includes a stage group on the base which is used to hold, load and unload wafers. The stage group may have a plurality of wafer stages 301. The plurality of wafer stages 301 may sequentially circularly move between a first position (pre-align position) and a second position (pre-exposure position). The stage group may be controlled by a close-loop control system, or an open-loop control system, etc.

Further, the exposure apparatus includes an alignment detection unit 302 above the first position 311 of the base. The alignment detection unit 302 may be used to detect stage fiducials on the wafer stages 301 at the first position. The alignment detection unit 302 may also be used to detect alignment marks on wafers on the wafer stages 301, and align the wafers. Various sensors may be used in the alignment detection unit 302, such as a laser sensor, an infrared sensor, or an position sensor, etc.

Further, the exposure apparatus also includes a cylindrical reticle system 305 above the second position of the base. The cylindrical reticle system 305 may be used to hold a cylindrical reticle 303, and to cause the cylindrical reticle 303 to rotate along the center axis of the cylindrical reticle system 305.

Further, the exposure system also includes an optical projection unit 309 between the cylindrical reticle stage 305 and the base. The optical projection unit 309 may project light onto exposure regions of the wafers on the wafer stages 301, and perform exposure. After the wafer stages 301 move from the first position to the second position, an unidirectional scan may be performed along a scanning direction. The cylindrical reticle 303 may rotate along the center axis of the cylindrical reticle stage 305, and the light through the cylindrical reticle 303 may be projected on the wafer on the wafer stage 301. Thus, a column of exposure regions on the wafer along the scanning direction may be exposed.

Further, the exposure apparatus may also include a main control unit 300. The main control unit 300 may communicate with the wafer stages 301, the alignment detection unit 302, the cylindrical reticle system 305, and the optical projection unit 309, etc. The main control unit 300 may be used to manage wafer alignment and exposure processes. The main control unit 300 may also be used to send out various kinds of commands, receive feedback information from various units, manage position information, and calculate lateral movement constants, rotation constants, and amplification constants of the wafer stages 301 and the cylindrical reticle 303.

Further, the exposure apparatus may also include an encoder plate 306 having a first opening 311 and a second opening 312. The encoder plate 306 may be used to align wafers, wafer stages 301 and cylindrical reticle 303, etc.

Further, the exposure apparatus may also include a plurality of cables, such as charging cables 307 for charging a power source of the wafer stages 301. Other cables may also be used for communications of different components.

Further, the exposure apparatus may also include an illuminator box 308. The illuminator box 308 may have a light source inside. The light source may be used to expose the wafers.

Further, the exposure apparatus may also include a time fiducial unit (not shown). The time fiducial unit may be used to provide a fiducial time unit signal, and cause the collection of all signals of the wafer alignment and exposure processes to be related with time.

The detailed structures of the exposure apparatus are described below together with various illustrative drawings.

Figure 4:
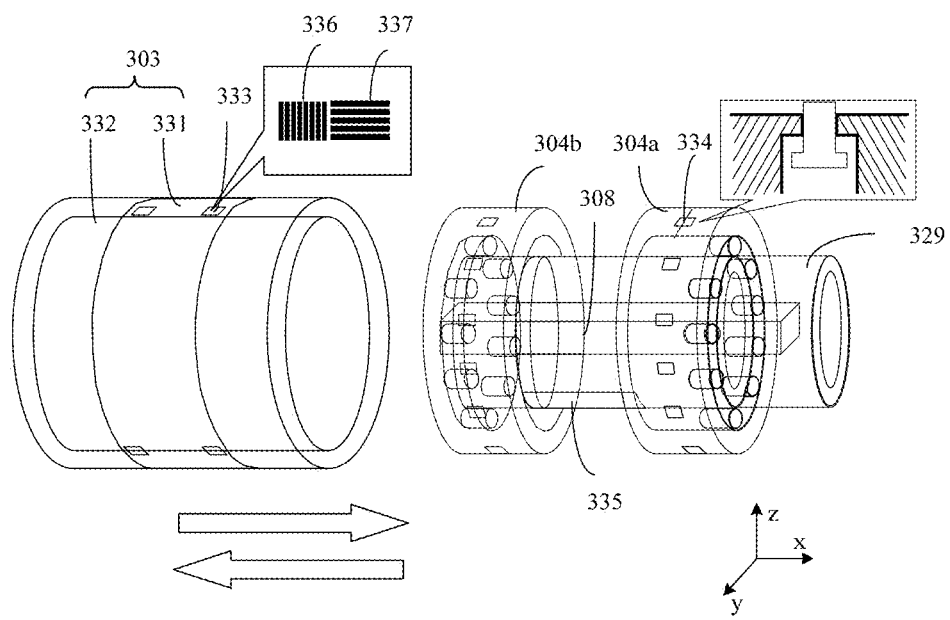
Figure 5:
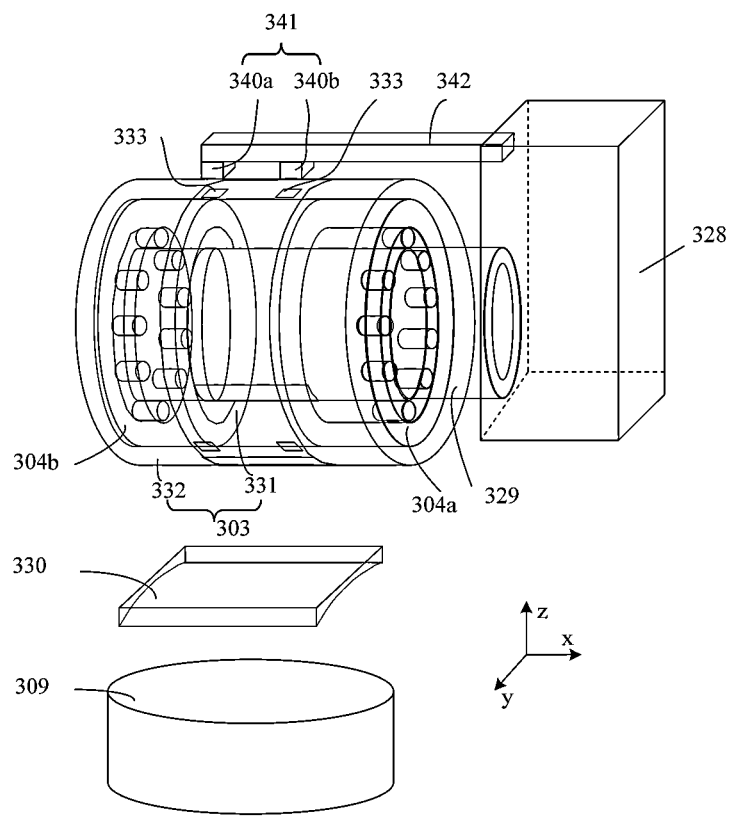

FIG. 4 and FIG. 5 illustrates the detail structures of the cylindrical reticle system shown 305 in FIG. 3.

As shown in FIGS. 4-5, the cylindrical reticle system 305 includes a rectile stage frame 328, a center shaft 329 at one end of the recticle stage frame 328, a first bearing 304a, a second bearing 304b, reticle pre-alignment imaging sensors 341, the cylindrical reticle 303, and a control unit (not shown). The control unit may coincident with the main control unit 300.

The reticle stage frame 328 may be used to support the cylindrical reticle 303 through the center shaft 329. The reticle stage frame 328 may be connected with a fourth drive unit (not shown). The fourth drive unit may drive the reticle stage frame 328 to move along the x-axis direction, the y-axis direction, and the z direction. The fourth drive unit may also drive the reticle stage frame 328 to rotate around the x-axis direction, the y-axis direction, and the z direction.

The first bearing 304a and the second bearing 304b may all have a bearing outer ring, a bearing inner ring, a bearing cage and a plurality of rolling elements between the bearing outer ring and bearing inner ring and held by the bearing cage. The rolling elements may be balls and/or cylinders.

In certain other embodiments, the first bearing 304a and the second bearing 304b may be electromagnetic bearings. An electromagnetic bearing may include a bearing outer ring, a bearing inner ring, and coils between the bearing outer ring and the bearing inner ring. A rotation of the electromagnetic bearing may be precisely adjusted by varying the electric current distribution of the coils.

The bearing inner ring of the first bearing 304a may be fixed at an end of the center shaft 329 near the reticle stage frame 328. The bearing inner ring of the second bearing 304b may be fixed at the other end of the center shaft 329 far from the reticle stage frame 328. That is, the first bearing 304a is fixed at one end of the center shaft 329 near the reticle stage frame 328; and the second bearing 304b is fixed at the other end of the center shaft 329 far from the reticle stage frame 328.

The cylindrical reticle 303 may be installed on the bearing outer rings of the first bearing 304a and the second bearing 304b. That is, inner surfaces of the non-imaging areas 332 of the cylindrical reticle 303 may contact with the bearing outer rings of the first bearing 304a and the second bearing 304b. When the first bearing 304a and the second bearing 304b rotate around the center shaft 329, the cylindrical reticle 303 may also rotate around the center shaft extension tube 329. The center shaft 329 may be equivalent to a center rotation axis of the cylindrical reticle 303.

The bearing outer rings of the first bearing 304a and the second bearing 304b may have a plurality of first gripping holders 334 as shown in the inserted figure in FIG. 4. When the cylindrical reticle 303 moves along x direction, and the non-imaging areas 332 of the cylindrical reticle 303 harness on surfaces of the bearing outer rings of the first bearing 304a and the second bearing 304b, a pressure may be generated on the inner surfaces of the non-imaging areas 332 of the cylindrical reticle 303 by the first gripping holders 334, which may cause the cylindrical recticle to attach on the bearing outer rings more tightly.

In one embodiment, the first gripping holder 334 may have a protruding part and a driving part connecting with the protruding part. When the cylindrical reticle 303 is harnessed (or installed) on the surfaces of the bearing outer rings of the first bearing 304a and the second bearing 304b, the driving part may drive the protruding part to move outwardly (far from the center shaft 329), and may cause the protruding part to contact with the inner surfaces of the non-imaging areas 332 of the cylindrical reticle 303. Thus, a pressure may be formed on the inner surfaces of the non-imaging areas 332.

When the cylindrical reticle 303 is uninstalled from the surfaces of the bearing outer rings of the first bearing 304a and the second bearing 304b, the driving part may drive the protruding part to move inwardly (close to the center shaft 329), and cause the protruding part to separate from the inner surface of the non-imaging areas 332 of the cylindrical reticle 303. Thus, the cylindrical reticle 303 may be removed from the bearing outer rings of the first bearing 304a and the second bearing 304b.

The first gripping holders 334 may be distributed with equal angles on the bearing outer rings of the first bearing 304a and the second bearing 304b. A number of the first gripping holders 334 on the first bearing 304a and a number of the first grip holders on the second bearing 304b may be equal. Thus, pressure on the inner surfaces of the non-imaging areas 332 of the cylindrical reticle 303 applied by the first gripping holders 334 may be equivalent. The deformation of the cylindrical reticle 303 may be prevented, and the installation accuracy of the cylindrical reticle 303 may be improved.

As shown in FIG. 4, the cylindrical reticle 303 may be a hollow cylinder. The cylindrical reticle 303 may include an imaging area 331 in the middle portion of the cylinder and two non-imaging areas 332 at both sides of the middle imaging area 331. The imaging area 331 may have a plurality of reticle alignment marks 333.

The imaging area 331 may at least have two groups of reticle alignment marks 333, and each group of reticle alignment marks 333 may include two mask alignment marks. Four mask alignment marks 333 of the two groups may locate at four corners of the imaging area 331. A connecting line of the centers of two mask alignment marks 333 of each group may be parallel to the center axis of the center shaft 329.

Each of the reticle alignment marks 333 may have a fifth optical grating 336 parallel to a rotation direction of the cylindrical reticle 303, and a sixth optical grating 337 vertical to the fifth optical grating 336. A cross line of the symmetric center of the fifth grating 336 and the symmetric center of the sixth grating 337 may be parallel to the center axis of a center shaft extension tube 329. Thus, subsequently described reticle alignment sensors/wafer stage fiducials on the wafer stages 301 (shown in FIG. 3) may detect at least four groups of position information of the reticle alignment marks 333 by detecting at least two groups of reticle alignment marks 333. A position relationship between the wafer stages 301 and the cylindrical reticle 303 may be formed. Further, the amplification coefficients of the cylindrical reticle 303 in X direction and Y direction, the rotation coefficients and the orthogonality coefficient may be calculated by a main control unit 300 using the four groups of position information.

In certain other embodiments, the imaging area 331 of the cylindrical reticle 303 may have a plurality of reticle exposure areas (may correspond to a plurality of exposure areas on a wafer). Each of the reticle exposure areas may have at least two groups of reticle alignment marks 333. When an alignment process of the cylindrical reticle 303 is performed, reticle alignment sensors/wafer stage fiducials may detect the reticle alignment marks of each of reticle exposure areas. Thus, a relationship between the reticle exposure areas of the cylindrical reticle 303 and the corresponding exposed areas on the wafer may be formed, the patterns of the reticle exposure areas on the cylindrical reticle 303 may be transferred to the corresponding exposure areas on the wafer.

As shown in FIG. 5, the center shaft 329 is fixed at one side of the reticle stage frame 328. The center shaft 329 is a hollow structure which may be used to place the illuminator box (may also refer as an exposure light source) 308 as shown in FIG. 3. The center shaft 329 may also have an illumination slit 335 (as shown in FIG. 4) penetrating through the bottom. The illumination slit 335 may be parallel to the center axis of the center shaft extension tube 329. Light illuminating from the illuminator box 308 may reach on the imaging area 331 of the cylindrical reticle 303 through the illumination slit 335. Then light illuminating through the reticle 303 may be projected on the exposure areas of the wafer on the wafer stage 301, and the wafer may be exposed.

Various light sources may be used as the illumination box 308. In one embodiment, the illumination box 308 may be a KrF excimer laser (wavelength may be approximately 248 nm) or an ArF excimer laser (wavelength may be approximately 193 nm). The illumination box 308 may also be an $F_2$ laser (wavelength may be approximately 157 nm), or an extreme ultraviolet light source (wavelength is approximately 13.5 nm), etc. The light of the illumination box 308 may also be a glow discharge in ultraviolet region generated from a high pressure mercury light source (i line, or g line, etc).

A length of the illumination slit 335 (in the x-axis direction) may be equal to a width of the imaging area 331 of the cylindrical reticle 303 (in the x-axis direction). A width of the illumination slit 335 may be in a range of approximately 1 mm~80 mm.

As shown in FIG. 5, reticle pre-alignment imaging sensors 341 may be installed above the cylindrical rectile 303. The reticle pre-alignment imaging sensors 341 may be fixed on the reticle stage frame 328 by an extension part. The reticle pre-alignment imaging sensors 341 may be used to detect the reticle alignment marks 333 on the imaging area 331 of the cylindrical reticle 303. The loading and rotation status of the cylindrical reticle 303 may be estimated by signals detected by the reticle pre-alignment imaging sensors 341.

Further, as shown in FIG. 5, the reticle pre-alignment imaging sensors 341 may have two sub-detection units: the first sub detection unit 340a and the second sub detection unit 340b. The sub detection units may include a linear array of photo detectors. The sub detection units may also include two-dimensional arrays of fast imaging detectors, such as charge coupled detectors, or CMOS imaging sensors, etc.

A distance between the first sub-detection unit 340a and the second sub detection unit 340b may equal to a distance between two reticle alignment marks 333 of each group of reticle alignment marks 333. When the cylindrical mask 303 is installed on the bearing outer rings of the first bearing 304a and the second bearing 304b, and the first bearing 304a and the second bearing 304b drive the cylindrical reticle 303 to rotate at least one cycle, the reticle pre-alignments imaging sensors 341 may detect at least two groups of reticle alignment marks 333. At least four electrical signals changing with time may be obtained.

Therefore, the rotation status (rotation characteristics in a zy-coordinate plane) and the installation status (may include a position in the x-direction and a position in y-direction of the coordinate) of the cylindrical reticle 303 may be estimated by the delay of time, the repeatability of signals, the period of pulse signals and the width of the pulse signals which may be compared between the four electrical signals.

Further, the reticle pre-alignment imaging sensors 341 may also have a height detection unit (not shown). The height detection unit may be used to detect a concentricity of the cylindrical reticle 303 with respect to the first bearing 304a and the second bearing 304b, and to send the concentricity bias information back to the first griping holders 334. The first gripping holders 334 may adjust their protruding size of the protruding part to cause the cylindrical reticle 303 and the first bearing 304a and the second bearing 304b to be concentric. The height detection unit may detect the height by detecting a height of a reflection point of a light reflected by the surface of the cylindrical reticle 303. The protruding size of the protruding part of the first gripping holders 334 may be adjusted by the driving parts of the first gripping holders 334.

Further, the cylindrical reticle system may also include a first drive unit (not shown). The first drive unit may connect with the first bearing 304a and/or the second bearing 304b. The first drive unit may be used to drive the first bearing 304a and the second bearing 304b to rotate around the center shaft 329.

Further, the cylindrical reticle system may also include a second drive unit (not shown). The second drive unit may be used to install (along the positive direction of the x-axis) or uninstall (along the negative direction of the x-axis) the cylindrical reticle 303 onto the bearing outer rings of the first bearing 304a and the second bearing 304b.

As shown in FIG. 5, additionally or optionally, a cylindrical lens unit 330 may be installed between the cylindrical reticle system and the optical projection unit 309. The cylindrical lens unit 330 may be right underneath the imaging area 331 of the cylindrical reticle 303. The cylindrical lens unit 330 may have a concave surface and a flat surface, and the flat surface may face the cylindrical reticle system. The cylindrical lens unit 330 may be used to calibrate a focus plane of the light passing through the cylindrical reticle 303, transform a cylindrical focus plane passing through the cylindrical reticle 303 to a flat focus plane. Thus, the light passing through the cylindrical reticle 303 and the optical projection unit 309 may be precisely projected on the exposure areas of the wafer.

The cylindrical lens unit 330 may be a single lens, or a plurality of lenses. In one embodiment, the cylindrical lens unit 330 is a combination of a plurality of the lenses.

The optical projection unit 309 may be used to project the light passing through the cylindrical reticle 303 on the exposed area of the wafer on the wafer stage 301. When a KrF excimer laser or an ArF excimer laser is used as the light source in the illuminator box 308, the optical projection system 309 may be a refraction system, only made of optical refraction devices (such as lenses). When an $F_2$ laser is used as the light source in the illuminator box 308, the optical projection system 309 may be a deflection/refraction system, made of optical refraction devices, optical reflection devices, or a combination thereof.

A projected length of the perimeter of the outer surface of the cylindrical reticle 303 projected by the cylindrical lens unit 330 and the optical projection unit 309 may be equal to a length of an exposure area on a wafer (along a scanning direction). That is, referring to FIG. 3, when the cylindrical reticle 303 rotates around the center shaft 329 for one cycle, at the same time, the wafer stage 301 scans an exposure area along the scanning direction (arrow direction shown in FIG. 3), patterns on the imaging area 331 of the cylindrical reticle 303 may be completely transferred to an exposure area on the wafer. The cylindrical reticle 303 may continue rotating, and wafer stage 301 keeps scanning along the scanning direction, the patterns on the imaging area 331 of the cylindrical reticle 303 may be completely transferred to next exposure area on the wafer.

The rotating and scanning process may be repeated, a column of exposure areas distributed along the scanning direction may all be exposed. During the exposure process of the exposure areas, it may be unnecessary for the cylindrical reticle 303 to change a rotation direction, and for the wafer stages to change a scanning direction as well. Thus, when the exposure area is changed, it may be unnecessary to have an accelerating process or a decelerating process. When a series of exposure areas along the scanning direction are exposed continuously, the wafer stages may keep a constant speed. Therefore, the time for exposure processes may be significantly reduced, and the exposure efficiency of the exposure apparatus may be increased.

Alternatively, the projected length of the perimeter of the outer surface of the cylindrical reticle 303 projected by the cylindrical lens unit 330 and the optical projection unit 309 may be equal to a length of a plurality of exposure areas on a wafer (along a scanning direction). That is, when the cylindrical reticle 303 rotates around the center shaft 329 for one cycle, the wafer stage 301 scans on the plurality of exposure areas along the scanning direction at the same time. The exposure efficiency can be further increased.

In another embodiment, the cylindrical reticle system may include: a reticle stage frame; a center shaft fixed at one side of the reticle stage frame; a first bearing and a second bearing. The first bearing may be fixed on one end of the center shaft near the reticle stage frame. The first bearing and the second bearing may all have a bearing outer ring, a bearing inner ring, and a plurality of the rolling elements. The bearing inner rings of the first bearing and the second bearing may be fixed on the center shaft. Two side faces of the bearing outer ring of the first bearing and the bearing outer ring of the second bearing facing each other may have slots.

The cylindrical reticle system may also include a cylindrical reticle. The cylindrical reticle may be a hollow cylinder. The cylindrical reticle may have an imaging area in the middle and non-imaging areas at both ends of the imaging area. The non-imaging areas of the cylindrical reticle may be clamped in the slots of the side faces of the bearing outer rings of the first bearing and the second bearing. The center shaft may perforate the hollow part of the cylindrical reticle. When the first bearing and the second bearing rotate around the center shaft, the cylindrical reticle may also rotate around the center shaft.

Further, the cylindrical reticle system may also include a second drive unit. The second drive unit may be used to install the cylindrical reticle into the slots on the side surfaces of the bearing outer rings of the first bearing and the second bearing. The second drive unit may also be used to uninstall the cylindrical reticle from the slots on the side surfaces of the bearing outer rings of the first bearing and the second bearing.

The second bearing may be a detachable bearing. The second bearing may connect with a third drive unit. The third drive unite may be used to fix or remove the second bearing from the center shaft extension tube. In order to conveniently fix the second bearing, the center shaft extension tube may have a plurality of protruding parts distributing with equal angles. The inner surface on the bearing inner ring of the second bearing may have a plurality of the groves corresponding to the protruding parts. When the groves on the inner surface of the bearing inner ring of the second bearing grips the protruding parts on the center shaft extension tube, the second bearing may be fixed on the center shaft extension tube.

A process for installing the cylindrical reticle may include uninstalling the second bearing from the center shaft extension tube using the third drive unit; installing one non-imaging area of the cylindrical reticle into the slot of the bearing outer ring of the first bearing using the second driving unit; and installing the second bearing to cause the other non-imaging area of the cylindrical reticle to be clamped into the slot of the bearing outer ring of the second bearing.

In one embodiment, when the cylindrical reticle is installed, the cylindrical reticle may be unlikely to touch surfaces of the bearing outer rings of the first bearing and the second bearing, it may prevent the inner surface of the cylindrical reticle from being scratched by the first bearing and the second bearing. Further, the cylindrical reticle is installed between the first bearing and the second bearing, thus it may be convenient to connect the second drive unit with the first bearing and the second bearing.

The bearing outer rings of the first bearing and the second bearing may have plurality of second gripping holders. When the non-imaging areas of the cylindrical reticle are installed in the slots of the bearing outer rings of the first bearing and the second bearing, the second gripping holders may generate a pressure on the outer surface of the non-imaging areas of the cylindrical reticle, which may cause the cylindrical reticle to be fixed tightly.

The second gripping holders may distribute on the bearing outer rings of the first bearing and the second bearing with equal angles, thus a uniform pressure may be generated onto the outer surface of the non-imaging areas. The deformation of the cylindrical reticle may be prevented, and the installation accuracy of the cylindrical recticle may be improved.

The center shaft is hollow, and an illuminator box may be installed in the hollow part of the center shaft. The bottom of the hollow center shaft may have a slit penetrating through the center shaft. The slit may be parallel to the center axis of the center shaft. The light emitting from the illuminator box may irradiate on the imaging area of the cylindrical reticle through the slit, and may be projected on the exposure area of the wafer on the wafer stage by an optical projection unit. Thus, the wafer may be exposed.

Referring to FIG. 3, the wafer stages 301 may be driven by a magnetic suspension system to move along a scanning direction (the arrow direction) in the xy-plane. The wafer stages 301 may also move from a first position to a second position by the magnetic suspension system. The wafer stages 301 may move along the positive direction of the y-axis (the scanning direction), the negative direction of the y-axis, the positive direction of the x-axis, the negative direction of the x-axis, the positive direction of the z-axis, and the negative direction of the z-axis.

The magnetic suspension system may be a maglev planar motor. The stator of the maglev planar motor may be fixed on the top surface of the base. The rotor of the maglev planar motor may be fixed on the bottom surface of the wafer stages 301. The maglev planar motor may be a permanent magnet dynamic maglev planar motor, a permanent magnet moving-iron maglev planar motor, or a maglev induction planar motor, etc.

The wafer stages 301 may sequentially move on the base. As shown in FIG. 3, when a plurality of wafer stages 301 carrying wafers are sequentially aligned at the first position, they may sequentially move to the second position. At the same time, the cylindrical reticle 303 may rotate around the center axis of the cylindrical reticle stage 305. The light penetrating through the cylindrical reticle 303 may be projected on the wafer on one wafer stage 301, thus a column of exposure regions along the scanning direction may be exposed. After exposing the column of the exposure regions, the wafer stage 301 may sequentially move from the second position to the first position to perform an alignment. The alignment and exposure processes may be repeated until the entire wafer are exposed.

When the wafer is exposed, it may unnecessarily need to change the scanning direction the wafer stages 301. At the same time, it may unnecessarily need to change the rotation direction of the cylindrical reticle 303. Thus, it may unnecessarily need to have a deceleration and an acceleration process during the process for exposing each exposure area, a total exposure time of each exposure region may be significantly reduced. The yield in per unit time of the exposure apparatus may be significantly increased.

The wafer stages 301 may have corresponding sub-control units (not shown). The sub-control units may be inside of the wafer stages 301. The sub-control units may be used to control the position of the wafer stages 301, the movement of the wafer stages 301, and the alignment of the wafers. The sub-control units may communicate with the main control unit 300, the magnetic suspension system, the alignment detection unit 302, and the cylindrical reticle system.

In one embodiment, when performing an exposure process, the wafer stages 301 may scan along one direction of the y-axis with a pipeline mode. The cylindrical reticle 303 may rotate around the center axis of the cylindrical reticle system 305, the light passing through the cylindrical reticle 303 may be projected on the wafer on the wafer stages 301. Thus, a column of exposure areas on the wafer may be exposed.

Therefore, a number of the wafer stages 301 may be greater than, or equal to two, which may increase the number of wafers carried by the wafer stages 301, and improve the efficiency of the exposure. In one embodiment, the number of the wafer stages 301 may be 2, 3, 4, 5, 6, 7, 8, 9, 10, 11, 12, 13, 14, 15, 16, 17, 18, 19, 20, 21, 22, 23, 24, or 25, etc.

If the number of the wafer stages is two, the sub control units on the wafer stages 301 may communicate with the main control unit 300, the alignment detection unit 302 and the cylindrical reticle system, etc., with a wired connection. In certain other embodiments, when the number of the wafer stages 301 is greater than two, the sub-control units on the wafer stages 301 may communicate with the main control unit 300, the alignment detection unit 302 and the cylindrical reticle system, etc., with a wireless communication method. Since the wafer stages 301 may move circularly on the base, the wireless communication method may avoid the difficulties of placing wires and the movement of the wafer stages 301 which may be required for a wired communication method.

The wireless communication method may include: a Bluetooth technology, a infrared data association technology, a wireless fidelity (Wi-Fi) technology, a wireless application protocol (WAP), an ultra wideband technology, or a near field communication (NFC) technology, etc.

In one embodiment, if a wireless communication technology is used for the wafer stages 301 to communicate with peripheral circuits, each of the wafer stages 301 may have a power storage unit (not shown) used to store the power for operating the wafer stages 301. The power for operating the wafer stages 301 may include the power for moving the wafer stages 301, the power for operating the sub control units, and the power for the communication between the wafer stages 301 and the peripheral circuits. The power storage unit may be fast charging battery packs, or super capacitors, which may be able to store a relatively large amount of power, and may be charged in a relative fast speed.

As shown in FIG. 3, in order to charge the power storage unit of the wafer stage 301, the exposure apparatus may have the charging cable 307 and a charging port 310. When the charging cable 307 is connected with the charging port 307, the charging cable may charge the power storage unit of the wafer stage 301.

If the number of the wafer stages 301 is two, the charging cable 307 and the charging port 310 may be connected with an immovable method.

If the number of the wafer stages 301 is equal to, or greater than two, the exposure apparatus may have a cable connection unit. The cable connection unit may be used to form a detachable connection between the charging cable 307 and the power storage unit on the wafer stages 301. When the wafer stages 301 move to a certain position (such as the first position), a connection may be formed between the charging cable 307 and the charging port 310 by the cable connection unit, the charging cable 307 may charge the power storage unit.

When the charging cable 307 moves to a next position (such as the second position) with the wafer stages 301, the charging cable 307 may disconnect with the charging port 310 by the cable connection unit, a charging process may be finished. When a plurality of wafer stages 301 moves cyclically, the difficulties for arranging wires may be effectively solved. The charging process may be performed during an exposure process.

In certain other embodiments, the charging process may be performed when the exposure apparatus is at a standby status. Specifically, when the wafer stages 301 are moving to a certain position, a connection may be formed between the charging cable 307 and the power storage unit on the wafer stage 301 by the cable connection unit, the power storage unit may be charged by the charging cable 307, and the wafer stages 301 and the charging cable 307 may be kept static. After a certain period of time, the charging cable 307 may disconnect with the wafer stage 301 by the cable connection unit.

The cable connection unit may include a clamping unit (not shown) and a drive unit (not shown). The clamping unit may be used to clamp the charging cable 307, and move the charging cable 307 in a micrometer scale. The drive unit may be used to cause the clamping unit to move along the x-axis, the y-axis and the z-axis, and to rotate around the x-axis, the y-axis and the z-axis.

Figure 6:
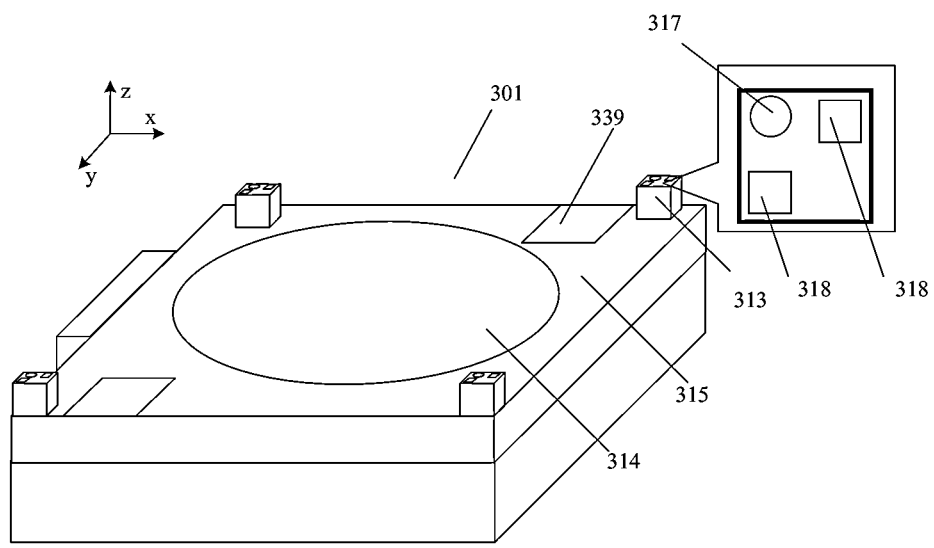

In order to achieve an accuracy position of multiple wafer stages 301, the exposure apparatus may have position detection units. Referring to FIG. 3 and FIG. 6, the position detection unit may include an alignment detection system 302, an encoder plate 306 between the optical projection unit 309 and the wafer stages 301, and encoder plate readers 313 on the top surface of the wafer stages 301.

As shown in FIG. 6, the top surface of the wafer stage 301 may have a wafer holding region 314 and a peripheral region 315 surrounding the wafer holding region 314. The encoder plate readers 313 may be at the peripheral region 315 of the top surface of the wafer stage 301. Each of the encoder plate readers 315 may have two encoder detector units 318. Each of the encoder detector units 318 may have optical emission units (not shown), optical receiver units (not shown), and sub-recognition units (not shown), etc.

The optical emission units may be used to emit detection light. The optical receiver units may be used to receive the light reflected by the encoder plate 306, and covert the light signal to an electric signal varying with time. The sub-recognition units may be used to perform a signal amplification process, a signal filtering process, a direction sensing process, a pulse width calculation process, and/or a data counting process, etc, thus the displacement of the wafer stage 310 may be found after a signal processing.

When a number of the encoder plate readers 315 is greater than one, each of the sub recognition units may send signals processed by amplifying or filtering, etc. to a main recognition unit (not shown). The main recognition unit may perform a direction sensing process, a pulse width calculation process, and/or a data counting process, etc., thus the displacement of the wafer stage 301 may be found. A direction of the light emitted from the optical emission unit may be inclined to the encoder plate 306, that is, the irradiating direction of the emission light may have a certain angle with the normal of the encoder plate 306, which may cause the reflected optical signal from the encoder plate 306 to have a relatively large amplitude. Further, the emission light on the two encoder detector units 318 may be both inclined to a direction opposite to the two encoder detector units 318, which may cause the two encoder detector units 318 to have different phases when the wafer stage 301 moves along the z-axis. Thus, the displacement of the wafer stage 301 along the z-axis direction may be determined.

The number of the encoder plate readers 313 may be at least three. The three encoder plate readers 313 may be distributed at different positions of the peripheral region 315 of the wafer stage 301. In one embodiment, the number of the encoder plate readers 313 is four. The four encoder plate readers 313 are at the four corners of the peripheral region 315 of the wafer stage 301. A distance between each of the encoder plate readers 313 and the center of the wafer stage 301 may be equal or different.

Referring to FIG. 6, each of the encoder plate readers 313 may have a zeroing mark detection unit 317. The zeroing mark detection unit 317 may be used to detect a zeroing mark on the encoder plate 306. In one embodiment, the zeroing mark detection unit 317 may be an imaging alignment sensor. The zeroing mark detection unit 317 may include a light source (such as a halogen light), an optical imaging system, and a camera (such as a CCD camera), etc.

The zeroing mark detection unit 317 may irradiate the zeroing mark on the encoder plate 306 using a wide band light from the light source, the camera may receive the reflected signal from the zeroing mark using the optical imaging system. Thus, the zeroing mark may be imaged on the viewing filed of the camera. After a signal processing of the image of the zeroing mark on the viewing field of the camera, a position relationship between the zeroing marks and the center of the viewing field may be obtained.

The zeroing mark detection unit 317 may return the position relationship information to the sub-control unit on the wafer stage 301, the wafer stage 301 may be driven to adjust until the zeroing mark appear at the center of the viewing field. A coarse position information (information obtained by the encoder plate readers 313) of the wafer stages 301 may be obtained, and a coarse alignment of the wafer stage 301 may be finished.

A pull-in range of the camera of the zeroing mark detection unit 317 may be approximately 100 μm~300 μm. After the coarse alignment of the wafer stage 301, a position accuracy of the wafer stage 301 may be in a range of approximately ±2 μm. The position accuracy may be sufficient for subsequent wafer alignments and cylindrical reticle alignments.

Figure 7:
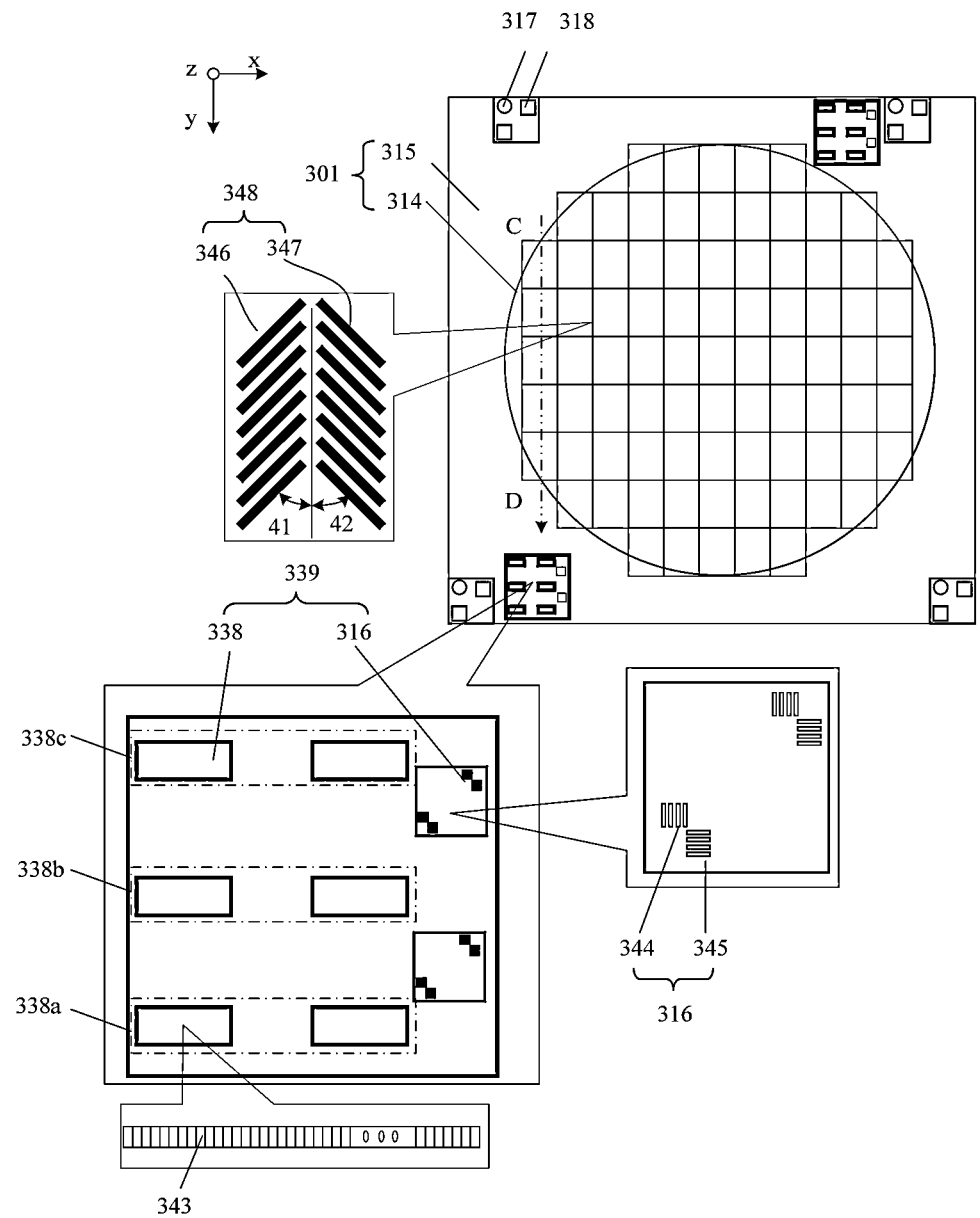

As shown in FIG. 7, the peripheral region 315 of the wafer stage 301 may also have reticle alignment sensors/wafer stage fiducials 339. The reticle alignment sensors/wafer stage fiducials 339 may include reticle alignment sensors 338 and wafer stage fiducials 316. A number of reticle alignment sensors/wafer stage fiducials 339 may be two or more. In one embodiment, the number of reticle alignment sensors/wafer stage fiducials 339 is two. The two reticle alignment sensors/wafer stage fiducials 339 may be distributed along a diagonal direction at two corners of the wafer stage.

The reticle alignment sensors 338 may be used to detect the reticle alignment marks 333 on the cylindrical reticle 303 shown in FIG. 4, and the position relationship between the cylindrical reticle 303 and the wafer stage 301 may be formed. Thus the position relationship between the cylindrical reticle 303 and the wafer on the wafer stage 301 may also be formed, an alignment process of the cylindrical reticle 303 may be finished.

The wafer stage fiducials 316 may be used for a precise positioning of the wafer stage 301. When the zeroing mark detection unit 317 is at a position of the zeroing detection mark, and the coarse alignment is finished, the wafer stage 301 may move to cause the alignment detection unit 302 to detect the wafer stage fiducials 316 of the wafer stage 301, a precise position information (information detected by the encoder plate readers 313) of the wafer stage 301 (or the wafer stage fiducials 316) may be obtained. The precise position information of the wafer stage 301 may be used as the zero position (origin) of the coordinate of the wafer stage 301, thus a fine alignment of the wafer stage 301 may be achieved. In certain other embodiments, after the fine alignment of the wafer stage 301, the information detected by the encoder detector units 318 (as shown in FIG. 6) may be correspondingly reset, the information after the resetting process may be used as the zero position (origin) of the coordinate of the wafer stage 301.

Further, as shown in FIG. 7, the wafer stage fiducials 316 may be at least two groups. The two groups of wafer stage fiducials 316 may distribute along the scanning direction (the y direction) in the peripheral region 315 of the wafer stage 301. A connection line of the centers of the two groups of wafer stage fiducials 316 may be parallel to the y-axis. Each of the wafer stage fiducials 316 may have two wafer stage fiducials 316 distributing orthogonally on the wafer stage 301. Each of the wafer stage fiducials 316 may have a plurality of first gratings 344 and a plurality of second grating 345.

The first gratings 344 and the second gratings 345 may distribute orthogonally. The first gratings 344 may have a plurality of first grating strips distributed along a first direction, the second gratings 345 may have a plurality of second grating strips distributed along a second direction, and the first grating strips may be perpendicular to the second grating grips.

When the wafer stage 301 moves under the alignment detection unit 302 (referring to FIG. 2), a position information of four wafer stage fiducials 316 may be obtained by detecting the two groups of the wafer stage fiducials 316 using the alignment detection unit 302. Lateral movement constants in x and y directions, amplify constants in x and y directions, rotation constants in xy plane and orthogonal constants of the wafer stage 301 may be obtained by calculating the position information performed by the main control unit 300.

Further, referring to FIG. 7, a wafer on the wafer stage 301 may have a plurality of exposure regions. The exposure regions may be isolated by scribe lines. Alignment marks 348 on the wafer may locate in the scribe lines. The alignment marks 348 may have a plurality of third gratings 346 and a plurality of second gratings 347. The first gratings 346 and the second gratings 347 may symmetrically distribute at both sides of a center line of the scribe lines. The first grating 347 may have a first angle 41 with the center line, and the second gratings 348 may have a second angle 42 with the center line. The first angle 41 may be equal to the second angle 42. An angle of the first angle 41 and the second angle 42 may be in a range of approximately 0°~90°. In one embodiment, the first angle 41 and the second angle 42 are both 45°.

The alignment detection unit 302 (as shown in FIG. 3) may have a first sub-detection unit (not shown) to detect the wafer stage fiducials 316 on the wafer state 301 and the alignment marks 348 on the wafer. The first sub-detection unit may be a one-dimensional array of optoelectronic sensors. When a detection process is performed, an optical system of the alignment detection unit 302 may irradiate the stage fiducials 316 of the wafer stage 301 or the wafer align marks 348 of a wafer, reflected light from the stage fiducials 316 of the wafer stage 301 or the wafer align marks 348 of the wafer may be received by the one-dimensional array of optoelectronic sensors, electrical signals varying with time may be outputted by the one-dimensional array of optoelectronic sensors. Whether or not the wafer stage fiducials 316 or the wafer alignment marks 348 are detected may be determined by identifying a time delay, a width of pulses and intervals of the pulses of the electrical signals outputted from the one-dimensional array of optoelectronic sensors.

In a specific detection process, the wafer stage 301 may move to a pre-alignment position (the first position of the base) firstly, the first sub detection unit may detect the wafer stage fiducials 316 on the wafer stage 301 when the wafer stage 301 is moving along the y direction. Then the wafer stage 310 may continue moving along the y direction, the first sub detection unit may detect the wafer alignment marks on the wafer. It may be unnecessary for the wafer stage 301 to move repeatedly in the xy plane, thus wafer alignment time may be saved, and the output in per unit time may be improved.

The first sub detection unit may also be a two dimensional imaging sensor (such as a CCD imaging sensor). When the alignment detection unit 302 detects the wafer stage fiducials 316, the optical system of the alignment detection unit 302 may irradiate the wafer stage fiducials 316, reflected light from the wafer stage fiducial 316 may form an image in the view field of a camera of the alignment detection unit 302. A position relationship information of the wafer stage fiducials 316 related to the center of the view field of the camera may be obtained after processing the image signals in the camera. The position relationship information may be sent back to the sub control unit of the wafer stage 301, and the position of the wafer stage 301 may be adjusted by the sub control unit until the wafer stage fiducials 316 is imaged in the center region of the view field of the camera.

The alignment detection unit 302 may also include a second sub-detection unit. The second sub detection unit may be used to detect the leveling of the wafer stage 301.

The reticle alignment sensors 338 may be at least three groups. Each group of the reticle alignment sensors 338 may have two reticle alignment sensors. A cross line between the two reticle alignment sensors may be parallel to the center line of the center shaft extension tube 329. Each group of reticle alignment sensors 338 (two sensors) may be used to correspondingly detect two reticle alignment marks 333 on the cylindrical reticle 303 (shown in FIG. 3). A distance between the centers of two sensors of each group of the reticle alignment sensors 338 may be equal to a distance between the centers of the two projected images on the wafer stage 301. Wherein the projected images are images of the two reticle alignment marks 333 projected by the optical projection unit 309 (shown in FIG. 3) of the exposure apparatus. Thus, the reticle alignment marks 333 may be precisely detected.

The reticle alignment sensors 338 may be a one-dimensional array of optoelectronic sensors 343. As shown in FIG. 7, the one-dimensional array of optoelectronic sensors 343 may includes a plurality of the sub sensor units aligned along the x-axis. When light irradiates on the one-dimensional array of optoelectronic sensors 343, the one-dimensional array of optoelectronic sensors 343 may send out electrical signals varying with time.

In one specific detection process, light from the illuminator box 308 (may also refer as the exposure light) may irradiate the reticle alignment marks 333 on the cylindrical reticle 303 (as shown in FIG. 5), the light passing through the reticle alignment marks 333 and the optical projection unit 309 may be received by the one-dimensional array of optoelectronic sensors 343, and electrical signals varying with time may be sent out by one-dimensional array of optoelectronic sensors 343. Whether the reticle alignment marks 333 are detected may be judged by the time delay, the width of the pulse, and the intervals of the output electrical signals.

As shown in FIG. 7, in one embodiment, the reticle alignment sensors 338 are three groups including a first reticle alignment sensor 338a, a second reticle alignment sensor 338b, and a third reticle alignment sensor 338c. Surfaces of the three groups of reticle alignment sensors 338 may be different. The surface of the first reticle alignment sensor 338a may have a standard height. The surface of the second reticle alignment sensor 338b may be lower than the surface of the first reticle alignment sensor 338a. The surface of the third reticle alignment sensor 338c may be higher than the surface of the first reticle alignment sensor 338a. When detecting the reticle alignment marks 333, the first reticle alignment sensor 338a, the second reticle alignment sensor 338b, and the third reticle alignment sensor 338c may be at the exact focus plane and/or off the exact focus plane of the optical system (the optical projection unit 309), respectively. Thus, an exact focus distance may be found when using the reticle alignment sensors 338 to align the cylindrical reticle 303 through calculating the detected imaging contrast from the three sensors 338a, 338b, and 338c.

In one embodiment, when the wafer stages 301 move underneath the optical projection unit 309 (shown in FIG. 3), and the reticle alignment marks 333 are detected, the first reticle alignment sensor 338a may be at the exact focus plane, the second reticle alignment sensor 338a may be at a negatively off focus plane, and the third reticle alignment sensor 338c may be at a positively off focus plane. According to the position information (may refer to a height along the z-direction), a height of the first reticle alignment sensor 338a, and the relationship between the center of the optical system and the designed height of the base, an exact focus plane may be obtained. Other combination of the heights of the first reticle alignment sensor 338a, the second reticle alignment sensor 338b, and the third reticle alignment sensor 338c may also be used.

Specifically, when the reticle alignment marks 333, the wafer stage 301 may firstly move to cause the first reticle alignment sensors 338a to move underneath the optical projection unit 309, the exposure light may irradiate the reticle alignment marks 333 on the cylindrical reticle 303 through the illumination slit 335. At the same time, the cylindrical reticle 303 may rotate at last one cycle around the center axis of the center shaft 329, the light passing through the reticle alignment marks 333 may be received by the first reticle alignment sensor 338a.

Then, the wafer stage 301 may continue to move along the scanning direction (may refer to the positive direction of the y-axis) to cause the second reticle alignment sensor 338b to move underneath the optical projection unit 309. At the same time, the cylindrical reticle 303 may rotate at last one cycle around the center axis of the center shaft extension tube 329, the light passing through the reticle alignment marks 333 may be received by the second reticle alignment sensor 338b.

Further, the wafer stage 301 may continue to move along the scanning direction (may refer to the positive direction of the y-axis) to cause the third reticle alignment sensor 338c to move underneath the optical projection unit 309. At the same time, the cylindrical reticle 303 may rotate at last one cycle around the center axis of the center shaft 329, the light passing through the reticle alignment marks 333 may be received by the third reticle alignment sensor 338c.

The wafer stage 301 may not move along the z direction when it move along the y-direction. The first reticle alignment sensor 338a, the second reticle alignment sensor 338b, and the third reticle alignment sensor 338c may obtain a plurality of electrical signals respectively after the above movements of the wafer stage 301. By comparing the electrical signals obtained from the same reticle alignment marks 333 by the first reticle alignment sensor 338a, the second reticle alignment sensor 338b, and the third reticle alignment sensor 338c, a height information of the reticle alignment sensors 338 corresponding to a maximum peak value of the electrical signals may be obtained. Further, according the height information, the position information of the wafer stage 301 (may refer to a height along the z direction) and the relationship between the center of the optical system and the designed height of the base, an exact focus plane may be obtained.

A height difference between the surface of the second reticle alignment sensor 338b and the first reticle alignment sensor 338a may be in a range of approximately 50 nm~1000 nm. A height different between the surface of the third reticle alignment sensor 338c and the first reticle alignment sensor 338a may be in a range of approximately 50 nm~1000 nm. Thus, a relatively high sensitivity for the reticle alignment sensors 333 to detect the exact focus plane may be obtained, and the obtained exact focus distance may be relatively accurate.

The reticle alignment detection unit 338 may be at an overlap region of an extended region of first exposure region of the wafer along the scanning direction (extended along the CD direction shown in FIG. 7) and the peripheral region 315. After the wafer stage 301 moves to a pre-exposure position, the reticle alignments marks 333 may be detected. After the reticle alignments marks 333 are detected, the wafer stage 301 may directly move along the scanning direction without moving along x direction and y direction repeatedly. A first column of exposure regions may be exposed, thus the time of the exposure process may be reduced.

Further, referring to FIG. 3, the encoder plate 306 may be fixed on the base (not shown) of the exposure apparatus, a width of the encoder plate 306 may be greater than a width of the wafer stage 301; and a length of the encoder plate 306 may be greater than a line distance between the alignment detection unit 302 and the optical exposure unit 309. Thus, when the wafer stage 301 is at a first position, a second position, and or moves from the first position to the second position, an accuracy position information may always be obtained by a position detection unit consisting of the alignment detection unit 302 and the encoder plate 306, and the accuracy position information may be obtained during an alignment process and an exposure process. Therefore, the exposure precision may be improved. When the wafer stage 301 moves on other positions of the base, other appropriate methods may be used to detect the position, such as guide rails, photoelectrical sensors, or interferometers, etc.

As shown in FIG. 3, the encoder plate 306 may have the first opening 311 (may refer as a metrology window) and the second opening 312 (may refer as an exposure window). A position of the first opening 311 may correspond to a position of the alignment detection unit 302, i.e., the first opening 311 may be underneath the alignment detection unit 302. The first opening 311 may be used as an optical pass between the alignment detection unit 302 and the wafer stage 301. A position of the second opening 312 may correspond to a position of the optical projection unit 309, i.e., the second opening 312 may be underneath the optical projection unit 309. The second opening may be used as an optical pass between the optical projection unit 309 and the wafer stage 301.

Figure 8:
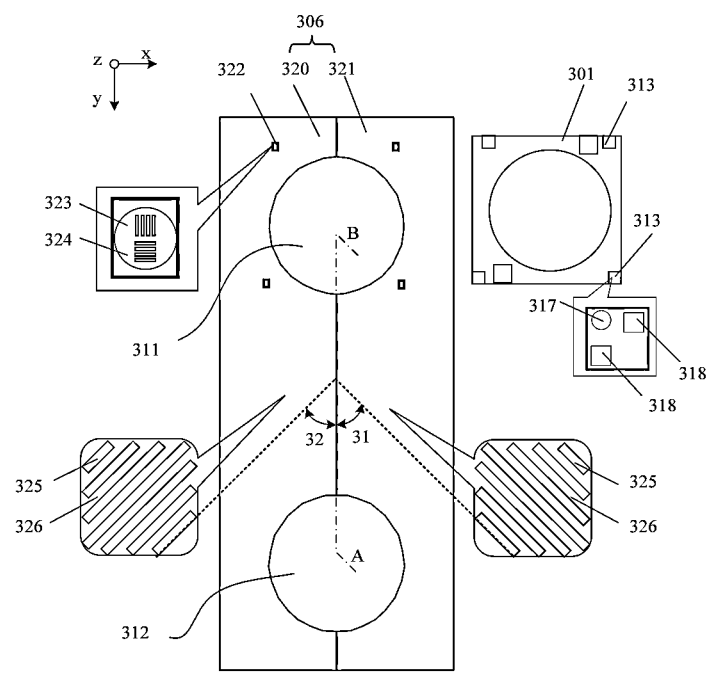

Further, as shown in FIG. 8, the encoder plate 306 may have a plurality of parallel equal lines 326 and spaces 325. The lines 326 and the spaces 325 may form a reflective grating. The surface of the encoder plate 306 having the lines 326 and the spaces 325 may face the top surface of the wafer stage 301. A distance between adjacent lines 326 and a distance between adjacent spaces 325 may be equal.

The encoder plate 306 may be made of glass, the lines 326 and the spaces 325 may be formed by etching the glass. In certain other embodiments, opaque strips may be formed on the transparent glass encoder plate 306 to form the lines 326 and the spaces 325, that is the reflective grating. The opaque stripes may be made of any appropriate material, such as metal thin film, etc.

As shown in FIG. 8, in one embodiment, the encoder plate 306 may have a first sub grating plate 320 and a second sub grating plate 321. The first sub grating plate 320 and the second sub grating plate 321 may be dissymmetrical. A symmetrical center line AB of the first sub grating plate 320 and the second sub grating plate 321 and the cross line between the alignment detection unit 302 and the center of the optical projection unit 309 may be on a same plane perpendicular to the base of the exposure apparatus. The symmetrical center line AB of the first sub grating plate 320 and the second sub grating plate 321 and a cross line between the center of the first sub grating plate 320 and the second sub grating plate 321 may be coincide.

In one embodiment, the lines 326 and the spaces 325 of the first sub grating plate 320 and the lines 326 and the spaces 325 of the second sub grating plate 321 may be dissymmetrical. The lines 326 of the first sub grating plate 320 may connect with the symmetrical center line AB, and have a first angle 32. The lines 326 of the second sub grating plate 321 may connect with the symmetrical center line AB, and have a second angle 31. The angle of the second angle 31 may be equal to the angle of the first angle 32. Thus, the accuracy of the first sub grating plate 320 may be identical to the accuracy of the second sub grating plate 321, a high accuracy of the position coordinate of the wafer stage 301 detected by the encoder plate readers 313 may be obtained. A moving direction and displacement of the wafer stage 301 may be obtained by the phase change, interval change, and pulse number of signals detected by the encoder plate readers 313.

Angles of the first angle 32 and the second angle 31 may be in a range of approximately 5°~85°. Specifically, the angle of the first angle 32 and the second angle may be 10°, 20°, 30°, 40°, 45°, 50°, 60°, 70°, or 80°, etc. When the wafer stage 301 moves under the first sub grating plate 320 and the second grating plate 321 along the x-axis, the y-axis or the z-axis, phase and interval changes between two electrical signals may be obtained by a single encoder detector unit 318. In certain other embodiments, the phase and interval changes between a plurality signals may be obtained from a plurality of the encoder detector unit 318. The moving direction and displacement of the wafer stage 301 may be determined and calculated by the obtained phase/interval changes.

In one embodiment, the number of the encoder plate readers 313 may be at least three; and each of the encoder plate readers 313 may include two encoder detector units 318. The encoder plate readers 313, the first sub grating plate 320 and the second sub grating plate 321 may form a detection system. Each of the encoder plate readers 313 may detect two degrees of freedom of the wafer stage 301, including the x-direction (or the y-direction) and the z-direction. A detection of six degrees of freedom may be achieved using at least three encoder plate readers 313. The six degrees of freedom may include the x-direction, the y-direction, the z-direction, the rotation x-direction, the rotation y-direction, and the rotation z-direction. The detection may be simple with a high accuracy, and the data processing may also be simple.

Referring to FIG. 8, when the encoder plate 306 and the encoder detector units 318 are used as a position detection unit, a detection accuracy may be in a range of approximately 1 nm~10 nm. When the wafer stage 301 moves within the measurement range of the encoder plate 306, the position error of the wafer stage 301 may be smaller than a range of approximately 1 nm~100 nm. A precise position relationship between the wafer stage 301, the wafer on the wafer stage 301, and the cylindrical reticle 303 may be achieved, thus the exposure apparatus may have a relatively high accuracy.

Further, as shown in FIG. 8, the encoder plate 306 in the peripheral region of the first opening 311 may have zeroing marks 322. The zeroing marks 322 may be used for a quick alignment and leveling capture. A number of the zeroing marks 322 may be equal to the number of the zeroing mark detection units 317. A distribution of the zeroing marks 322 may be same as a distribution of the zeroing mark detection units 317 on the wafer stage 301. That is, a pattern formed by center cross lines of the zeroing marks 322 on the encoder plate 306 may coincide with a pattern formed by center cross lines of the zeroing detection units 317 on the wafer stage 301. Thus, an accurate positioning of the wafer stage 301 may be achieved.

In one embodiment, the number of the zeroing marks 322 is corresponding to the number of the zeroing mark detection units 317. The number of the zeroing marks 322 may be four. As shown in FIG. 8, each of the zeroing marks 322 may have a plurality of first grating 323 distributed along the y-axis direction and a plurality of the second grating 324 distributed along the y-axis direction.

Figure 9:
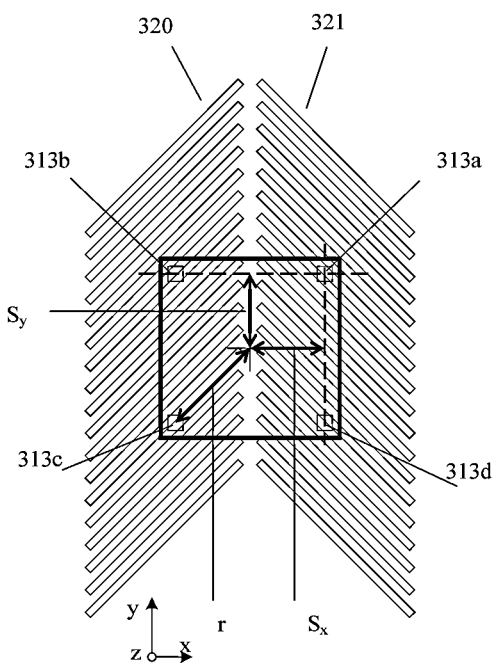

FIG. 9 illustrates an exemplary embodiment using a detection system consisting of four encoder plate readers 313, the first sub grating plate 320 and the second sub grating plate 321 to detect a position of the wafer stage 301. As shown in FIG. 9, the four encoder plate readers 313 may include a first encoder plate reader 313a, a second encoder plate reader 313b, a third encoder plate reader 313c, and a fourth encoder plate reader 313d. Distance between the center of the surface of the wafer stage 301 and the first encoder plate reader 313a, the second encoder plate reader 313b, the third encoder plate reader 313c, and the fourth encoder plate reader 313d may be equal. The distance may refer as "r". Cross lines of the centers of the four encoder plate reader may form a rectangle.

The x-axis coordinate of the wafer stage 301 obtained by the detection system may refer as $C_x$. The y-axis coordinate of the wafer stage 301 obtained by the detection system may refer as $C_y$. The z-axis coordinate of the wafer stage 301 obtained by the detection system may refer as $C_z$. The x-axis rotation constant obtained by the detection system may refer as $R_x$. The y-axis rotation constant obtained by the detection system may refer as $R_y$. The z-axis rotation constant obtained by the detection system may refer as $R_z$. Wherein:

$$Cx = \frac{E_2 + E_3 - E_1 - E_4}{2\sqrt{2}};$$

$$Cy = -\frac{E_1 + E_2 + E_3 + E_4}{2\sqrt{2}};$$

$$Cz = \frac{E_{1z} + E_{2z} + E_{3z} + E_{4z}}{4};$$

$$Rx = \frac{E_{1z} + E_{2z} - E_{3z} - E_{4z}}{4S_y};$$

$$Ry = \frac{E_{2z} + E_{3z} - E_{1z} - E_{4z}}{4S_x};$$

$$Rz = -\frac{E_4 - E_3}{2r}$$

Wherein: $E_1$, $E_2$, $E_3$, and $E_4$ may refer to detected values obtained by the first encoder plate reader 313a, the second encoder plate reader 313b, the third encoder plate reader 313c, and the fourth encoder plate reader 313d when the wafer stage 301 moves along the x-direction and/or the y-direction, respectively. $E_{1z}$, $E_{2z}$, $E_{3z}$, and $E_{4z}$ may refer to detected values obtained by the first encoder plate reader 313a, the second encoder plate reader 313b, the third encoder plate reader 313c, and the fourth encoder plate reader 313d when the wafer stage 301 moves along the z-direction, respectively. $S_y$ may refer to a vertical distance between the cross line of the centers of the first encoder plate reader 313a and the second encoder plate reader 313b and the center of the surface of the wafer stage 301. $S_y$ may refer to a vertical distance between the cross line of the centers of the first encoder plate reader 313a and the second encoder plate reader 313d and the center of the surface of the wafer stage 301. The above equations may be correct when the two encoder plates are angled at 45 degrees to the symmetry axis and orthogonal to each other.

FIGS. 10-17 illustrate certain steps of an exemplary exposure process using the above disclosed exposure apparatus. For illustrative purposes, four wafer stages may be used to describe the exposure process in details.

Figure 10:
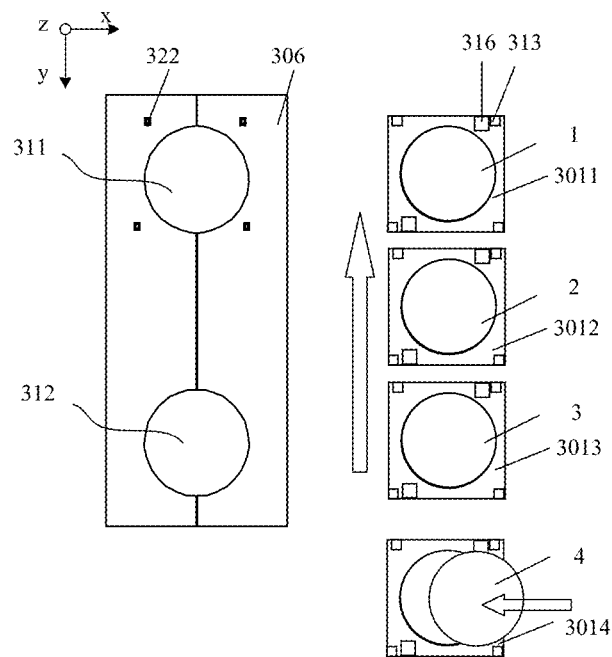
FIGS. 10-17 illustrate certain steps of an exemplary exposure process consistent with the disclosed embodiments.

As shown in FIG. 10, the exposure apparatus have four wafer stages including a first wafer stage 3011, a second wafer stage 3012, a third wafer stage 3013, and a fourth wafer stage 3014. A first wafer 1, a second wafer 2, a third wafer 3 and a fourth wafer 4 may be successively loaded on the first wafer stage 3011, the second wafer stage 3012, the third wafer stage 3013, and the fourth wafer stage 3014.

Before the exposure apparatus starts working, the first wafer stage 3011, the second wafer stage 3012, the third wafer stage 3013, and the fourth wafer stage 3014 may distribute in queue on the base of the exposure apparatus. When the exposure process is started, exposure programs may be firstly installed in the exposure apparatus. Then four wafers may be loaded on the four wafer stages successively. The wafer stages loaded with wafers may successively move toward a first position to align the wafers at the first position. Before aligning the first wafer 1 on the first wafer stage 3011, the second drive unit may install the cylindrical reticle 303 into the cylindrical reticle stage 305. After installing the cylindrical reticle 303, the cylindrical reticle 303 may rotate around the center shaft extension tube 329; and the pre-alignment imaging sensors 341 may detect the reticle alignment marks 333 and loading status and rotating status of the cylindrical reticle 303.

When the first wafer stage 3011, the second wafer stage 3012, the third wafer stage 3013, and the fourth wafer stage 3014 move in regions outside the encoder plate 306, tracks, interferometers, or grating plates may be used to detect their positions. An accumulated position errors may be less than 100 μm.

Figure 11:
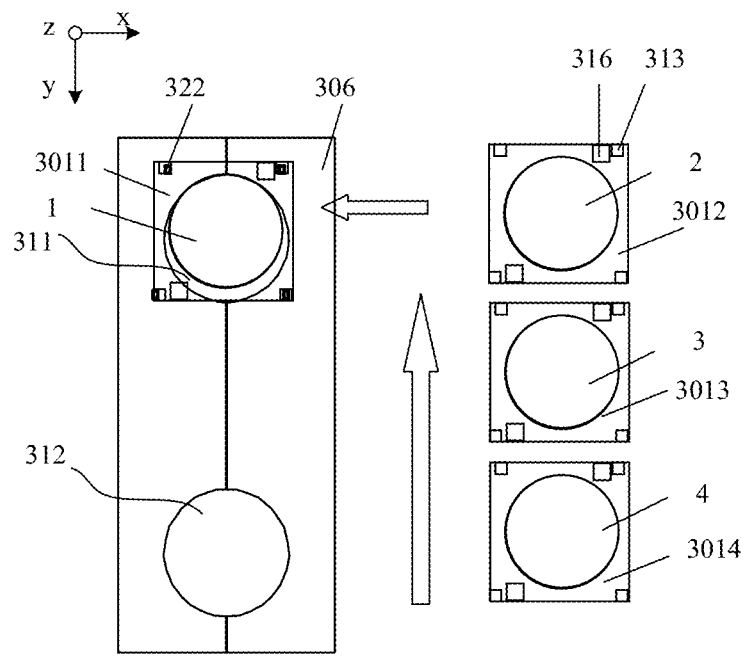

Further, as shown in FIG. 11, the first wafer stage 3011 moves to the first position of the base, i.e., a pre-alignment position underneath the first opening 311 of the encoder plate 306, the zeroing mark detection units 317 (shown in FIG. 8) on the first wafer stage 3011 may detect the zeroing marks 322 on the encoder plate 306, a coarse position information of the first wafer stage 3011 may be obtained, and a coarse alignment of the first wafer stage 3011 may be finished.

In one embodiment, if at least three zeroing mark detection units 317 have detected the corresponding zeroing marks 322, the coarse alignment of the wafer stage 3011 may be finished. If less than three zero mark detection units 317 have detected the corresponding zeroing marks 322, the coarse alignment may need to repeat.

After the coarse alignment of the wafer stage 3011 is finished, the wafer stage 3011 may quickly to move under the alignment detection unit 302 (referring to FIG. 3), the alignment detection unit 302 may detect the wafer stage fiducials 316 on the first wafer stage 3011, an accurate position information of the wafer stage 3011 (or wafer stage fiducials 316) may be obtained. At the same time, the accurate position information of the wafer stage 3011 may be used as a zero point (origin) of a position coordinate of the wafer stage 3011, and a fine alignment of the wafer stage 3011 may be finished.

In certain other embodiments, after finishing the fine alignment of the wafer stage 3011, the detected information of the encoder plate readers 313 on the wafer stage 3011 may be reset correspondingly, the reset zero information may be used as the zero (origin) of the position coordinate of the wafer stage 3011. The main control unit 300 may save and calculate the displacement bias of the wafer stage 3011 between the fine alignment and the coarse alignment.

After the alignment detection units 302 detect the wafer stage fiducials 316 on the first wafer stage 3011, the first wafer stage 3011 may move, the alignment detection unit 302 may detect alignment marks on the first wafer 1 loaded on the first wafer stage 3011, the position information of the alignment marks on the first wafer 1 may be obtained. The main control unit 300 may convert the position information of the alignment marks on the first wafer 1 to a position coordinate using the position information of the wafer stage fiducials 316 as an origin, a position management of exposure regions on the wafer 1 may be achieved. The related position information and position coordinate may be saved in the main control unit 300, and an alignment of the first wafer 1 may be finished. The main control unit 300 may save and calculate the displacement bias of the wafer stage 3011 between the fine alignment and the detection of the alignment marks on the first wafer 1.

Figure 12:
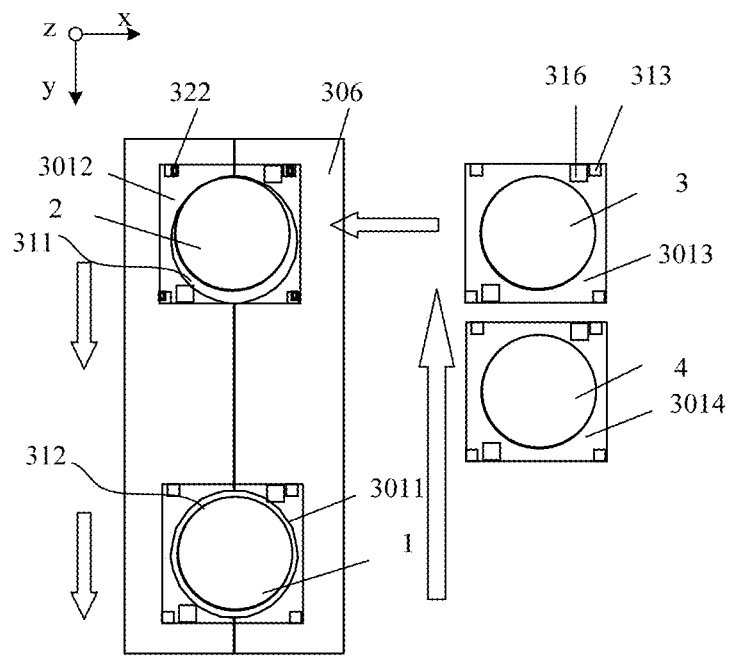

As shown in FIG. 12, after the alignment of the wafer 1, the first wafer stage 3011 may move from the first position to the second position, a pre-exposure position underneath the second opening 312 of the encoder plate 306. Then, the wafer stage 3011 may perform a unidirectional scan along a scanning direction, i.e., the positive direction of the y-axis. At the same time, the cylindrical reticle 303 may rotate around the center axis of the cylindrical reticle stage 305. Light passing through the cylindrical reticle 303 may be projected on the first wafer 1 on the first wafer stage 3011 by the optical projection unit 309 (shown in FIG. 3), thus a first column of exposed regions along the scanning direction may be exposed. At the same time, the second wafer stage 3012 may move to the first position of the base, and the second wafer 2 on the second wafer stage 3012 may be aligned.

Before exposing the first wafer 1, an exact focus distance may be obtained by detecting the reticle alignment marks 333 on the cylindrical reticle 303 using the reticle alignment sensors 338 with different heights, a position relationship between the cylindrical reticle 303 an the first wafer stage 3011 may be formed. Thus, a position relationship between the cylindrical reticle 303 and the first wafer 1 may be formed as well, and an alignment of the cylindrical reticle 303 may be finished. The related position information and position coordinate may be saved in the main control unit 300.

Referring to FIG. 7, since the reticle alignment sensors 338 may be at an overlapped region of an extended region of the first exposure region along the scanning direction (extends along the CD direction) and the peripheral region 315 of the top surface of the wafer stage 301, after the first wafer stage 3011 moves to the pre-exposure region, the reticle alignment marks 333 may be detected. After detecting the reticle alignment marks 333, the first wafer stage 3011 may unnecessarily move back and forth along the x-direction or the y-direction, thus the exposure time may be reduced.

When the first exposure region of the first wafer 1 is exposed, the wafer stage 3011 may keep the positive scanning direction of the y-axis, the rotation direction of the cylindrical reticle 303 around the center axis of the cylindrical reticle stage 305 may also keep same, thus after exposing the first exposure region of the first column of exposure regions, the scanning direction of the first wafer stage 3011 and the rotation direction of the cylindrical reticle 303 may unnecessarily change, a second exposure region of the first column of exposure regions may be exposed. Similarly, all the exposure regions of the first column may be exposed without changing the scanning direction of the first wafer stage 3011 and the rotation direction of the cylindrical reticle 303. Thus, when the first column of exposure regions of the first wafer 1 are exposed, the wafer stage 3011 may unnecessarily need to accelerate or decelerate, the time for the exposure process may be significantly reduced.

Before exposing the first exposure region of the first column of exposure regions of the first wafer 1, the first wafer stage 3011 may need an acceleration process. After exposing the last exposure region of the first column of exposure region, the first wafer stage 3011 may need a deceleration process.

In one embodiment, since the scanning direction of the first wafer stage 3011 may keep constant, on the basis providing a relatively high exposure resolution, the scanning speed may be increased. The scanning speed of the first wafer stage 3011 may be in a range of approximately 100 mm/s~10 m/s, or higher. Physically, the scanning speed may have no limitation except the position detections and the feedback time.

The time for the cylindrical reticle 303 to rotate around the center axis of the cylindrical reticle stage 305 for one circle may equal to the time for the first wafer stage 3011 to move one exposure region along the scanning direction. Thus, patterns of the cylindrical reticle 303 may be completely transferred onto the exposure regions on the first wafer 1, and an unidirectional step scanning exposure of the exposure regions on the first wafer 1 may be achieved.

In certain other embodiments, the time for the cylindrical reticle 303 to rotate around the center axis of the cylindrical reticle stage 305 for one circle may equal to the total time for the first wafer stage 3011 to move a plurality of exposure regions along the scanning direction. When the cylindrical reticle 303 rotate for one circle, a plurality of exposure regions of the first column of exposure region along the scanning direction may be exposed.

When the first column of exposure regions of the first wafer 1 on the first wafer stage 3011 are partially exposed, after finishing aligning the second wafer 2, the second wafer stage 3012 may move from the first position to the second position or a nearby position on the base to wait for an exposure. The third wafer stage 3013 may move to the first position to align the third wafer 3. Then, the fourth wafer stage 3014 may move toward the first position after loading the fourth wafer 4. The alignment of the second wafer 2 is similar as the alignment of the first wafer 1.

Figure 13:
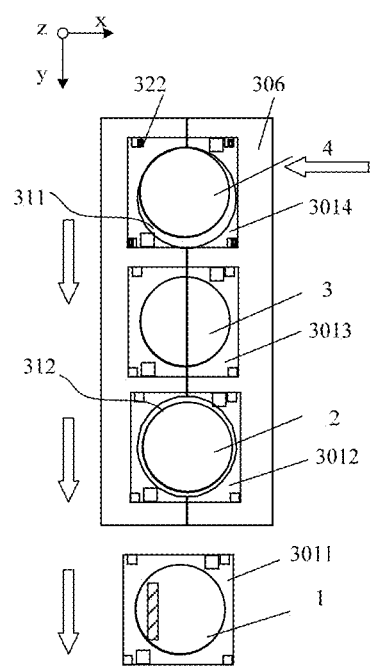

As shown in FIG. 13, when the exposure of the first column of exposure regions of the first wafer 1 on the first wafer stage 3011 is completed, the first wafer stage 3011 may continue to move along the positive direction of the y-axis, the second wafer stage 3012 may move to the second position. Then, the second wafer stage 3012 may perform an unidirectional scan along the scanning direction, i.e., the positive direction of the y-axis. At the same time, the cylindrical reticle 303 may rotate around the center axis of the cylindrical reticle stage 305, the light passing through the cylindrical reticle 303 may be projected on the second wafer 2 loaded on the second wafer stage 3012 by the optical projection unit 309. A first column of exposure regions of the second wafer 2 along the scanning direction may be exposed. At the same time, after aligning the third wafer 3, the third wafer stage 3013 may move from the first position toward the second position. The fourth wafer stage 3014 move to the first position, and the fourth wafer 4 may be aligned.

Before exposing the second wafer 2, an exact focus distance may be obtained by detecting the reticle alignment marks 333 on the cylindrical reticle 303 using the reticle alignment sensors 338 with different heights, a position relationship between the cylindrical reticle 303 and the second wafer stage 3012 may be formed. Thus, a position relationship between the cylindrical reticle 303 and the second wafer 2 may be formed, and an alignment of the cylindrical reticle 303 may be finished. The related position information and position coordinate may be saved in the main control unit 300.

Figure 14:
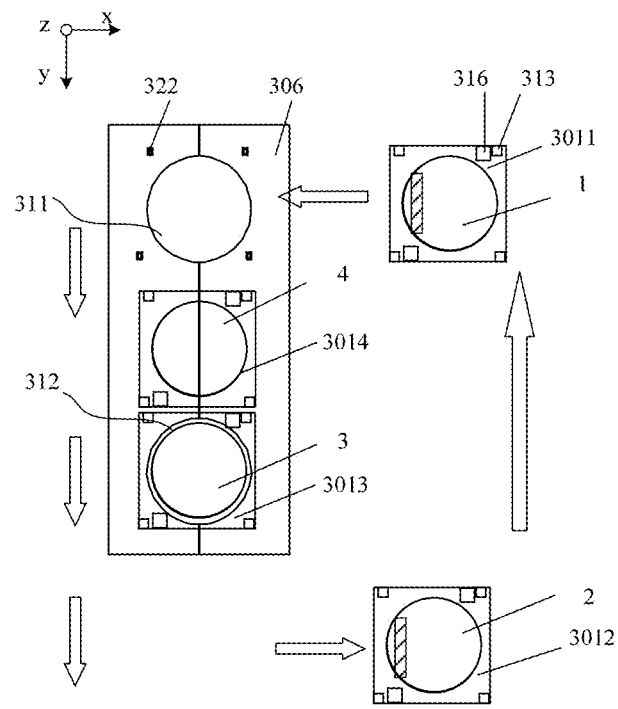

As shown in FIG. 14, the first wafer stage 3011 may move toward the first position. After the first column of exposure regions of the second wafer 2 are exposed along the scanning direction, the second wafer stage 3012 may move away from the second position and the third wafer stage 3013 may move to the second position. Then, the third wafer stage 3013 may perform a unidirectional scan along the scanning direction, i.e., the positive direction of the y-axis. At the same time, the cylindrical reticle 303 may rotate around the center axis of the cylindrical reticle stage 305, and the light passing through the cylindrical reticle 303 may be projected on the third wafer 3 loaded on the third wafer stage 3013 by the optical projection unit 309. A first column of exposure regions of the third wafer 3 along the scanning direction may be exposed. At the same time, after aligning the fourth wafer 4, the fourth wafer stage 3014 may move from the first position toward the second position.

Before exposing the third wafer 3, an exact focus distance may be obtained by detecting the reticle alignment marks 333 on the cylindrical reticle 303 using the reticle alignment sensors 338 with different heights, a position relationship between the cylindrical reticle 303 and the third wafer stage 3013 may be formed. Thus, a position relationship between the cylindrical reticle 303 and the third wafer 3 may be formed, and an alignment of the cylindrical reticle 303 may be finished. The related position information and position coordinate may be saved in the main control unit 300.

Figure 15:
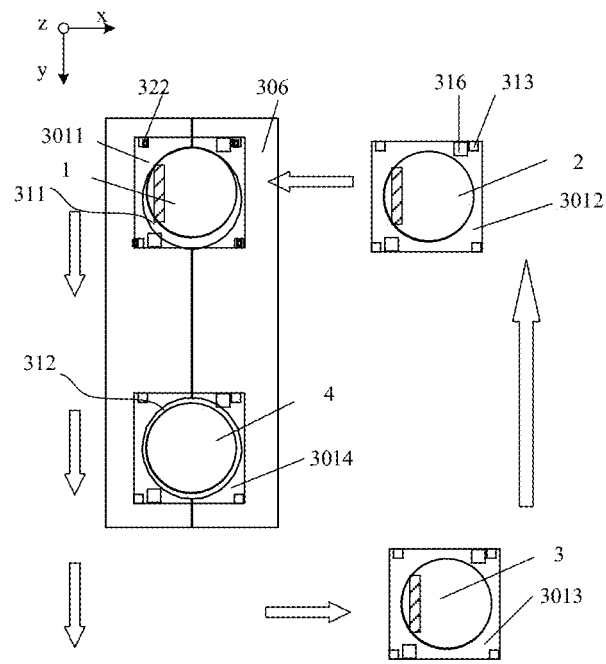

As shown in FIG. 15, after the first column of exposure regions of the third wafer 3 are exposed, the first wafer stage 3011 may move to the first position. The first wafer 1 on the first wafer stage 3011 may be aligned. The fourth wafer stage 3014 may move to the second position. Then, the fourth wafer stage 3014 may perform a unidirectional scan along the scanning direction, i.e., the positive direction of the y-axis. At the same time, the cylindrical reticle 303 may rotate around the center axis of the cylindrical reticle stage 305, and the light passing through the cylindrical reticle 303 may be projected on the fourth wafer 4 loaded on the fourth wafer stage 3014 by the optical projection unit 309. A first column of exposure regions of the fourth wafer 4 along the scanning direction may be exposed.

Since the main control unit 300 may be used to save and calculate the displacement bias of the wafer stage 3011 between the fine alignment and the coarse alignment and the displacement bias of the wafer stage 3011 between the fine alignment and the detection of the alignment marks on the first wafer 1, when the first wafer 1 on the first wafer stage 3011 is realigned, it may only need the zeroing mark detection unit 317 to detect the zeroing marks 322 on the encoder plate 306 and verify the position coordinate of the wafer stage 3011. The wafer position information may be obtained by the main control unit 300 by using the position information of the first wafer stage 3011 and certain types of calculation. Thus, a position management of the first wafer 1 may be achieved, and the time for realignment of the first wafer 1 may be reduced.

In certain other embodiments, when the first wafer 1 is realigned, the alignment detection unit 302 may detect the wafer stage fiducials 339 on the first wafer stage 1 and the alignment marks on the first wafer 1.

Figure 16:
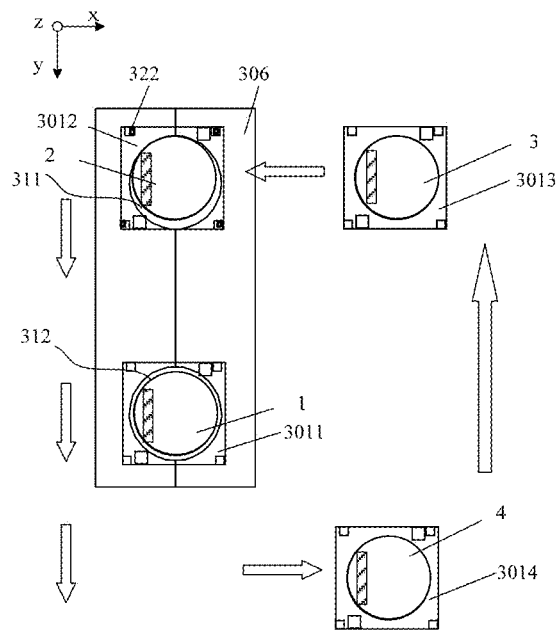

Further, as shown in FIG. 16, the first wafer stage 3011 may move from the first position to the second position, then the first wafer stage 3011 may perform an unidirectional scan along the scanning direction, i.e., the positive direction of the y-axis. At the same time, the cylindrical reticle 303 may rotate around the center axis of the cylindrical reticle stage 305, and the light passing through the cylindrical reticle 303 may be projected on the first wafer 1 on the first wafer stage 3011 by the optical projection unit 309. A second column of exposure regions of the first wafer 1 along the scanning direction may be exposed. At the same time, the second wafer stage 3012 may move to the second position of the base, the second wafer 2 on the second wafer stage 3012 may be aligned.

In one embodiment, since the position relationship between the cylindrical reticle 303 and the first wafer stage 3011 may be already formed when the first column exposure regions of the first wafer 1 are exposed, the reticle alignment marks 333 may unnecessarily need to be detected, a position relationship between the cylindrical reticle 303 and the first wafer stage 3011 for exposing the second column of exposure regions may be obtained by the main control unit 300 using the saved position relationship between the cylindrical reticle 303 and the first wafer stage 3011, and the displacement of the first wafer stage 3011 moving along the x direction, i.e., a distance along the x-direction for the wafer stage 3011 to move one exposure region comparing with the first column of exposed regions after aligning the first wafer 1 and before exposing the second column of exposure regions, the exposure time may be effectively reduced.

In certain other embodiments, before exposing the second column of exposure regions on the first wafer 1, the reticle alignment sensors 338 may detect the reticle alignment marks 333 on the cylindrical recticle 303, the position relationship of the cylindrical reticle 303 and the first wafer stage 3011 may be obtained.

Figure 17:
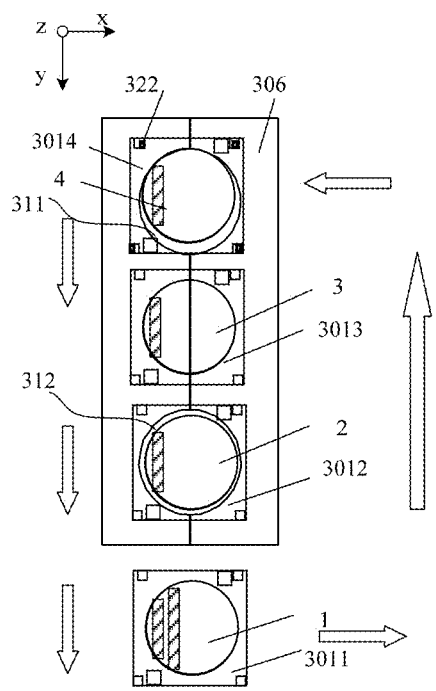

Further, as shown in FIG. 17, after the second column of exposure regions of the first wafer 1 are exposed, the first wafer stage 3011 may continue to move toward the first position of the base along the positive direction of the y-axis, and the second wafer stage 3012 may move to the second position. Then the second wafer stage 3012 may perform a unidirectional scan along the scanning direction, i.e., the positive direction of the y-axis. At the same time, the cylindrical reticle 303 may rotate around the center axis of the cylindrical reticle stage 305, the light passing through the cylindrical reticle 303 may be projected on the second wafer 2 on the second wafer stage 3012 by the optical projection unit 309. A second column of exposure regions of the second wafer 2 along the scanning direction may be exposed. At the same time, after the third wafer 3 is aligned, the third wafer stage 3013 may move from the first position toward the second position of the base. The fourth wafer stage 3014 may move to the first position 311, and the fourth wafer 4 on the fourth wafer stage 3014 may be aligned.

The first wafer stage 3011, the second wafer stage 3012, the third wafer stage 3013, and the fourth wafer stage 3014 may cyclically move on the base in a pipelined mode. The alignment and exposure processes may be repeated until all the exposure regions of the first wafer 1, the second wafer 2, the third wafer 3 and the fourth wafer 4 are exposed. When a certain wafer on one of the four wafer stages is completely exposed, a new wafer may be loaded.

The present exposure apparatus may have the cylindrical reticle 303 and a plurality of wafer stages 301. The cylindrical reticle 303 may rotate around the center axis of the cylindrical reticle system 305, one wafer stage 301 may perform a unidirectional scan along the scanning direction, the light passing through the cylindrical reticle 303 may be projected on a certain column of exposure regions on the wafers on the wafer stage 301, thus the certain column of exposure regions may be exposed along the scanning direction. When the certain column of exposure areas are exposed, since the cylindrical reticle 303 may return to the origin after rotating one circle, after exposing the certain column of the exposed areas, the rotation direction of the reticle 303 may unnecessarily change, and the scanning direction of the wafer stage 301 may also unnecessarily change, an exposure of a next exposure region in the same column may be achieved. Therefore, an accelerating process and a decelerating process may unnecessarily need when exposure regions in a same column are exposed, the total time for an exposure process may significantly reduced, and the yield in per unit time of the exposure apparatus may be increased.

In one embodiment, using the cylindrical reticle 303 may have a similar reticle alignment process as other exposure apparatuses. However, the wafer exposure map may be changed. Each column of exposure regions is unidirectional scan-exposed during one scan instead of one exposure shot. The only time loss may be to scan back the wafer for next column exposure. The throughput gain may be still substantial: For example: for a two-wafer stage configuration (alignment and leveling may be done in parallel, and may unnecessarily be counted as a throughput overhead), currently, each exposure area may need 0.26 seconds for entire scan, including acceleration (0.10 sec), scan-exposure (0.06 sec), de-acceleration (0.10 sec). For a scan speed of 600 mm/s and 300 mm wafer, each column may only needs about 2 times (back scan to prepare for next column exposure) of (0.1 sec+0.5+0.1 sec), but it may include the exposure of up to 9 shots (average of 7 shots), the time gain is: 0.26×7−0.7×2=1.82−1.4=0.42 sec, or 30% throughput gain. If the scan speed may be further increased, for example, 2 msec, assuming the acceleration and de-acceleration may use the same time, the gain will be more: 0.22×7−0.36×2=1.54−0.72=0.82 sec, i.e., 114% yield gain.

For more wafer stages, the gain in yield may be more since during one exposed wafer stage's back scan, other wafers can be exposed. For example, in case of a 25 wafer stage systems, the total processing time for 25 wafers may be estimated as: [(0.1+0.54+0.1+0.06×2 (time lag between wafer stage to wafer stage))×12 (column)+2 (first column reticle alignment)]×25=308 seconds, i.e., the yield will be 3600/308×25=292 wph which is much higher than current, about 3600/[(0.1+0.06+0.1)×110]=126 wph. Wherein, "wph" may refer to wafer per hour.

In certain other embodiments, the exposure system may have one wafer stage 301, the wafer stage 301 may unnecessarily go back the first position after the first column of the wafer is exposed. The wafer stage 301 may only need move to a next exposure region, and perform a unidirectional scan. At the same time, the cylindrical reticle 303 may rotate for one cycle, the next exposure region may be exposed. The exposure process may be repeated until the entire wafer is exposed.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A wafer alignment method, comprising:
    loading a wafer on each of a plurality of wafer stages successively;
    moving one of the wafer stages loaded with the wafer to a first position successively;
    zeroing the wafer at the first position using zeroing mark detection units to detect zeroing marks on an encoder plate,
    wherein zeroing the wafer includes: irradiating the zeroing marks on the encoder plate by a zeroing mark detection unit, receiving reflected signals from the zeroing mark using an optical imaging system of a camera, imaging the zeroing marks in a view field of the camera, processing the reflected signals to obtain a position relationship between the zeroing marks and a center of the viewing field, and moving the zeroing marks to the center of the view field by a sub control unit;
    aligning and leveling the wafer stage with the wafer using an alignment detection unit to detect wafer stage fiducials; and
    obtaining position information of a to-be-exposed column of exposure regions by detecting alignment marks on the wafer using the alignment detection unit.

2. The wafer alignment method according to claim 1, after obtaining the position information of the wafer, further including:
    moving the wafer to a second position; and
    performing a unidirectional scan to expose the column of exposure regions.

3. The wafer alignment method according to claim 1, wherein:
    the wafer alignment is to establish the coordinate relationship between wafer alignment mark positions and the wafer stage fiducials.

4. The wafer alignment method according to claim 1, wherein:
    the step of aligning and leveling the wafer stage is performed for each column of exposure regions.

5. The wafer alignment method according to claim 2, before performing the unidirectional scan, further including:
    performing a reticle alignment process.

6. The wafer alignment method according to claim 2, after moving the wafer to a second position, further including:
    moving a second wafer stage with a wafer to the first position.

7. The wafer alignment method according to claim 1, wherein:
    the encoder plate has a first opening and a second opening, and
    the alignment detection unit is above the first opening of the encoder plate.

8. The wafer alignment method according to claim 1, wherein:
    each of the wafer stages has a wafer loading region and a peripheral region surrounding the wafer loading region, and
    the peripheral region has reticle alignment sensors detecting reticle alignment marks on a cylindrical reticle to form a relationship between the wafer stage and the cylindrical reticle, and to align the cylindrical reticle.

9. The wafer alignment method according to claim 1, wherein:
    each of the wafer stages has a sub control unit inside.

10. The wafer alignment method according to claim 1, wherein:
    each of the wafer stages has a power storage unit and a charging port.

11. The wafer alignment method according to claim 1, wherein:
    the encoder plate has a plurality of equal lines and spaces, and
    the encoder plate has two sub encoder plates.

12. The wafer alignment method according to claim 1, wherein:
    a number of the zeroing marks is equal to a number of the zeroing mark detection units.

13. The wafer alignment method according to claim 1, wherein:
   each of the wafer stage fiducials has a first grating and a second grating.

14. The wafer alignment method according to claim 1, wherein:
   a charging cable is used to charge the power storage unit of the wafer stages.

15. The wafer alignment method according to claim 4, wherein:
   a first column of exposure regions on a first wafer and a corresponding column of exposure regions on a second wafer are each exposed prior to exposing a second column of the exposure regions on the first wafer.

* * * * *